(12) United States Patent
Shiozawa et al.

(10) Patent No.: US 6,383,884 B1
(45) Date of Patent: May 7, 2002

(54) METHOD OF MANUFACTURING SEMICONDUCTOR DEVICE

(75) Inventors: Katsuomi Shiozawa; Takashi Kuroi; Yasuyoshi Itoh; Katsuyuki Horita, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/496,057

(22) Filed: Feb. 2, 2000

(30) Foreign Application Priority Data

Sep. 9, 1999 (JP) .......................................... 11-255923

(51) Int. Cl.$^7$ .......................................... H01L 21/336
(52) U.S. Cl. ........................ 438/305; 438/525; 438/289
(58) Field of Search ................................ 438/305, 301, 438/302, 303, 304, 306, 525, 183, 289

(56) References Cited

U.S. PATENT DOCUMENTS

| 5,508,534 A | | 4/1996 | Nakamura et al. | |
| 5,578,522 A | | 11/1996 | Nakamura et al. | |
| 5,783,491 A | | 7/1998 | Nakamura et al. | |
| 5,960,270 A | * | 9/1999 | Mirsa et al. | 438/197 |
| 6,030,876 A | * | 2/2000 | Koike | 438/303 |
| 6,054,355 A | * | 4/2000 | Inumiya et al. | 438/296 |
| 6,177,336 B1 | * | 1/2001 | Kin et al. | 438/592 |
| 6,190,980 B1 | * | 2/2001 | Yu et al. | 438/302 |

FOREIGN PATENT DOCUMENTS

JP 2-3244 * 1/1990

* cited by examiner

Primary Examiner—Tuan H. Nguyen
(74) Attorney, Agent, or Firm—Oblon, Spivak, McClelland, Maier & Neustadt, P.C.

(57) ABSTRACT

A semiconductor device includes a silicon substrate (1), a pair of isolating insulation films (9), a channel region (2), a pair of source/drain regions (3), a pair of silicon oxide films (4) formed on an upper surface of the silicon substrate (1) so as to overlie the source/drain regions (3), and a gate structure (8) formed in a first recess defined by the upper surface of the silicon substrate (1) over the channel region (2) and side surfaces of the pair of silicon oxide films (4). The gate structure (8) includes a gate oxide film (5) formed on the upper surface of the silicon substrate (1), a pair of silicon oxide films (6) formed on lower part of the side surfaces of the pair of silicon oxide films (4), and a metal film (7) filling a second recess surrounded by upper part of the side surfaces of the silicon oxide films (4), the silicon oxide films (6) and the gate oxide film (5). A method of manufacturing the semiconductor device is provided which attains reduction in gate length without the decrease in driving capability to accomplish the increase in operating speed.

14 Claims, 21 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a MOSFET having a gate structure formed by a replacement technique.

2. Description of the Background Art

FIG. 34 is a cross-sectional view of a background art semiconductor device having a gate structure formed by the replacement technique. As shown in FIG. 34, the background art semiconductor device comprises: a silicon substrate 101; a pair of spaced source/drain regions 109 formed in an upper surface of the silicon substrate 101 and defining a channel region (not shown) therebetween in the upper surface of the silicon substrate 101; a pair of sidewalls 107 and a pair of silicon nitride films 108 which are formed on the upper surface of the silicon substrate 101 so as to overlie the source/drain regions 109; and a gate structure 106 formed in a recess defined by the upper surface of the silicon substrate 101 over the channel region and side surfaces of the sidewalls 107. The gate structure 106 comprises a gate oxide film 102 formed on the upper surface of the silicon substrate 101, and a gate electrode including a polysilicon film 103 formed on the gate oxide film 102, a barrier metal 104 formed on the side surfaces of the sidewalls 107 and an upper surface of the polysilicon film 103, and a metal film 105 formed on the barrier metal 104.

FIGS. 35 through 41 are cross-sectional views showing a method of manufacturing the background art semiconductor device shown in FIG. 34 in a step-by-step manner. Initially, an isolating insulation film (not shown) is formed in an isolation region of the silicon substrate 101, and thereafter ion implantation is performed to form a well, a doped channel region and the like (not shown). Then, a silicon oxide film 110, a polysilicon film 111 and a silicon oxide film 112 are formed by deposition or the like in stacked relation in the order named on the upper surface of the silicon substrate 101 (FIG. 35).

Next, a photoresist 113 is formed by a photolithographic technique on an upper surface of the silicon oxide film 112 over a region in which a dummy gate electrode is to be formed later (FIG. 36). Using the photoresist 113 as a mask, the silicon oxide film 112, the polysilicon film 111 and the silicon oxide film 110 are etched in the order named to expose the upper surface of the silicon substrate 101. Then, the photoresist 113 is removed. This provides the gate oxide film 102 selectively formed on the upper surface of the silicon substrate 101, and the dummy gate electrode formed on the gate oxide film 102 and having a multilayer structure including the polysilicon film 103 and a silicon oxide film 114 which are stacked in the order named. Thereafter, using the dummy gate electrode as a mask, ions 115 are implanted into the upper surface of the silicon substrate 101 to form a pair of extension regions 116 (FIG. 37).

A silicon nitride film is deposited on the entire surface of the resultant structure, and is etched back until the upper surface of the silicon substrate 101 is exposed, to form the sidewalls 107 on side surfaces of the dummy gate electrode. Using the dummy gate electrode and the sidewalls 107 as a mask, ions 117 are implanted into the upper surface of the silicon substrate 101 to form the pair of source/drain regions 109 (FIG. 38).

A silicon nitride film is deposited on the entire surface of the resultant structure, and is polished until an upper surface of the silicon oxide film 114 is exposed, to form the silicon nitride films 108 (FIG. 39). Using the silicon nitride films 108 as a mask, the silicon oxide film 114 is etched away to expose the upper surface of the polysilicon film 103 (FIG. 40). A barrier metal 118 and a metal film 119 are deposited on the entire surface of the resultant structure (FIG. 41). Next, the barrier metal 118 and the metal film 119 are polished until the upper surface of the silicon nitride films 108 is exposed by a CMP process. This provides the structure shown in FIG. 34. After the steps of forming an interlayer insulation film and forming an interconnect line and the like, the device is completed.

However, the background art semiconductor device and the method of manufacturing the same present problems to be described below.

Reductions in gate length and in gate resistance are important factors required to increase the operating speed of a MOSFET or to improve the driving capability and high frequency characteristic thereof. The reduction in gate length is attained by forming a narrower photoresist pattern by a photolithographic technique, but there is a limit on the formation of fine patterns because of an exposure limit. For example, if the photoresist 113 having a length L101 is formed in the step shown in FIG. 36, the gate length L100 of the gate electrode equals the length L101 as shown in FIG. 34. Thus, a first problem with the background art semiconductor device and the method of manufacturing the same is that it is impracticable that the gate length which is determined by the exposure limit of the photolithographic technique used in the formation of the photoresist 113 is less than the exposure limit of the photolithographic technique.

On the other hand, the reduction in gate resistance of the background art semiconductor device shown in FIG. 34 is attained by making the lengths of the barrier metal 104 and the metal film 105 greater than the length of the polysilicon film 103 (equal to the gate length L100). However, according to the method of manufacturing the background art semiconductor device in which the lengths of the barrier metal 104 and the metal film 105 are equal to the gate length L100, the increase in the lengths of the barrier metal 104 and the metal film 105 requires the increase in the gate length L100 itself, presenting a second problem in that the driving capability of the MOSFET decreases.

SUMMARY OF THE INVENTION

According to a first aspect of the present invention, a method of manufacturing a semiconductor device comprises the steps of: (a) selectively forming a multilayer structure including a gate insulation film and a dummy gate electrode stacked in the order named on an upper surface of a substrate, the dummy gate electrode having an upper part and a lower part; (b) forming a first insulation film in a side surface of the lower part; (c) forming a pair of source/drain regions in the upper surface of the substrate, with part of the upper surface of the substrate which underlies the gate insulation film lying between the pair of source/drain regions; (d) forming a second insulation film on the upper surface of the substrate overlying the pair of source/drain regions, the second insulation film having a thickness greater than the height of the first insulation film from the upper surface of the substrate, the second insulation film being in contact with the dummy gate electrode; (e) removing the dummy gate electrode while leaving the first insulation film, the step (e) being performed after the step (d); and (f) forming a gate electrode filling a recess defined by the gate insulation film and the first and second insulation films.

Preferably, according to a second aspect of the present invention, in the method of the first aspect, a thermal oxidation reaction proceeds at a lower rate in the upper part than in the lower part in the step (a). The first insulation film is formed by thermally oxidizing the dummy gate electrode in the step (b).

Preferably, according to a third aspect of the present invention, the method of the second aspect further comprises the step of (x) introducing an impurity into the upper surface of the substrate by using the dummy gate electrode as a mask to form an extension region, the step (x) being performed between the steps (a) and (b).

Preferably, according to a fourth aspect of the present invention, in the method of the second aspect, only the upper part is doped with an impurity having an oxidation inhibiting effect in the step (a).

Preferably, according to a fifth aspect of the present invention, in the method of the second aspect, only the lower part is doped with an impurity having an oxidation promoting effect in the step (a).

Preferably, according to a sixth aspect of the present invention, in the method of the second aspect, the dummy gate electrode formed in the step (a) has the lower part made of a first material which is thermally oxidizable, and the upper part made of a second material which is not thermally oxidizable.

Preferably, according to a seventh aspect of the present invention, in the method of the sixth aspect, the step (a) comprises the steps of: (a-1) forming a polysilicon film of the first material and a silicon oxide film of the second material in stacked relation in the order named on the entire upper surface of the substrate; (a-2) etching away the silicon oxide film except where the dummy gate electrode is to be formed; and (a-3) etching away the polysilicon film by using the silicon oxide film as a mask, the step (a-3) being performed after the step (a-2).

According to an eighth aspect of the present invention, a method of manufacturing a semiconductor device comprises the steps of: (a) preparing a structure including a pair of spaced source/drain regions formed in an upper surface of a substrate, and a mask formed on the upper surface of the substrate and having an opening over a region lying between the pair of source/drain regions; and (b) introducing an impurity through the mask into the substrate.

Preferably, according to a ninth aspect of the present invention, in the method of the eighth aspect, the impurity is introduced into the substrate in step (b) by ion implantation angled with respect to the normal to the upper surface of the substrate.

Preferably, according to a tenth aspect of the present invention, in the method of the ninth aspect, the step (a) comprises the steps of: (a-1) selectively forming a dummy gate structure on the upper surface of the substrate; (a-2) forming the pair of source/drain regions in part of the upper surface of the substrate which is not covered with the dummy gate structure; (a-3) forming an insulation film serving as the mask on the upper surface of the substrate overlying the pair of source/drain regions, the insulation film being in contact with the dummy gate structure; and (a-4) removing the dummy gate structure, the step (a-4) being performed after the step (a-3). The method further comprises the step of (c) forming a gate structure filling the opening of the mask, the step (c) being performed after the step (b).

In accordance with the first aspect of the present invention, the gate length of a lower part of the gate electrode is made smaller than the gate length of an upper part thereof by the total width of the first insulation film. Therefore, the method of the first aspect can increase the operating speed of the semiconductor device and improve the high frequency characteristic thereof without decreasing the driving capability thereof.

In accordance with the second aspect of the present invention, the dummy gate electrode such that the thermal oxidation reaction proceeds at a lower rate in the upper part thereof than in the lower part thereof is formed in the step (a). This allows a simple thermal oxidation process to form the first insulation film in the lower part of the side surface of the dummy gate electrode.

In accordance with the third aspect of the present invention, the extension region is formed in the upper surface of the substrate before the step (b). Therefore, the thermal oxidation process in the step (b) causes the impurity in the extension region to thermally diffuse, forming an extension diffusion region.

In accordance with the fourth aspect of the present invention, the impurity having the oxidation inhibiting effect is introduced into only the upper part of the dummy gate electrode to inhibit the thermal oxidation reaction from proceeding in the upper part of the dummy gate electrode. Therefore, the method of the fourth aspect can suitably form the first insulation film in the lower part of the side surface of the dummy gate electrode.

In accordance with the fifth aspect of the present invention, the impurity having the oxidation promoting effect is introduced into only the lower part of the dummy gate electrode to promote the thermal oxidation reaction in the lower part of the dummy gate electrode. Therefore, the method of the fifth aspect can suitably form the first insulation film in the lower part of the side surface of the dummy gate electrode. Additionally, the method of the fifth aspect can reduce the oxidation time for the formation of the first insulation film, as compared with the method of the fourth aspect, to prevent the impurity, if introduced into the substrate, from being excessively thermally diffused.

In accordance with the sixth aspect of the present invention, the dummy gate electrode having the lower part made of the first material which is thermally oxidizable and the upper part made of the second material which is not thermally oxidizable is formed in the step (a). This allows a simple thermal oxidation process to form the first insulation film only in the lower part of the side surface of the dummy gate electrode. Additionally, since the upper part of the dummy gate electrode is not thermally oxidized, the method of the sixth aspect can form the gate electrode equal in size to the dummy gate electrode to set the value of the gate resistance precisely and easily.

In accordance with the seventh aspect of the present invention, polysilicon is adopted as the first material of the lower part of the dummy gate electrode, and silicon oxide having a higher selectivity to polysilicon than other materials such as silicon nitride is adopted as the second material of the upper part of the dummy gate electrode. Since the silicon oxide film is hardly etched in the step (a-3), the silicon oxide film need not be formed so thick in the step (a-1), and etching of the silicon oxide film in the step (a-2) is easily controlled.

In accordance with the eighth aspect of the present invention, the step (a) of forming the source/drain regions is followed by the step (b) of introducing the impurity into the substrate to form a doped region. Therefore, the impurity introduced into the doped region is not affected by the heat treatment for the formation of the source/drain regions. This prevents the doped region from being formed in a deeper position in the substrate and the resistance of the doped region from increasing.

In accordance with the ninth aspect of the present invention, the impurity ion implantation angled with respect to the normal to the upper surface of the substrate is preferred to form pocket regions near the confronting ends of the pair of source/drain regions, respectively.

In accordance with the tenth aspect of the present invention, the mask against ion implantation is used to form the gate structure in a self-aligned fashion.

It is therefore an object of the present invention to attain the reduction in gate length of a semiconductor device having a gate structure formed by a replacement technique without the decrease in driving capability of the semiconductor device, thereby to provide a method of manufacturing the semiconductor device which can increase the operating speed thereof and improve the high frequency characteristic thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
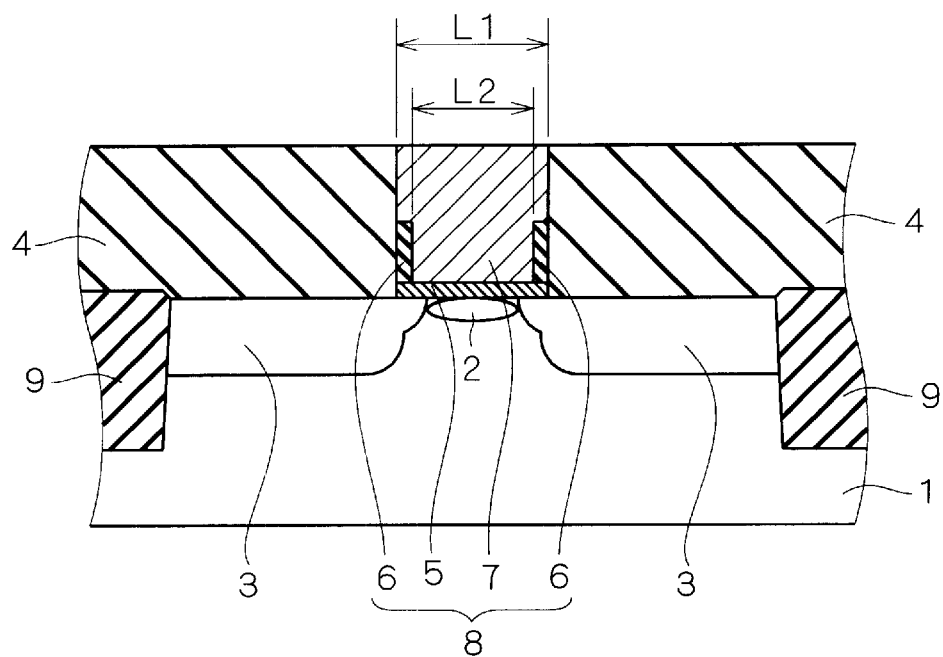
FIG. 1 is a cross-sectional view of a semiconductor device according to a first preferred embodiment of the present invention.

FIG. 1 is a cross-sectional view of a semiconductor device according to a first preferred embodiment of the present invention. As shown in FIG. 1, the semiconductor device according to the first preferred embodiment comprises: a silicon substrate 1; a pair of isolating insulation films 9 formed in an upper surface of the silicon substrate 1 on opposite sides of a device formation region; a pair of spaced source/drain regions 3 formed in the device formation region in the upper surface of the silicon substrate 1 and defining a channel region 2 therebetween; a pair of silicon oxide films 4 formed on the upper surface of the silicon substrate 1 so as to overlie the source/drain regions 3; and a gate structure 8 formed in a first recess defined by the upper surface of the silicon substrate 1 over the channel region 2 and side surfaces of the pair of silicon oxide films 4. The gate structure 8 comprises a gate oxide film 5 formed on the upper surface of the silicon substrate 1, a pair of silicon oxide films 6 formed on lower part of the side surfaces of the silicon oxide films 4, and a metal film 7 serving as a gate electrode and filling a second recess surrounded by upper part of the side surfaces of the silicon oxide films 4 on which the silicon oxide films 6 are not formed, the silicon oxide films 6 and the gate oxide film 5.

Figure 2:
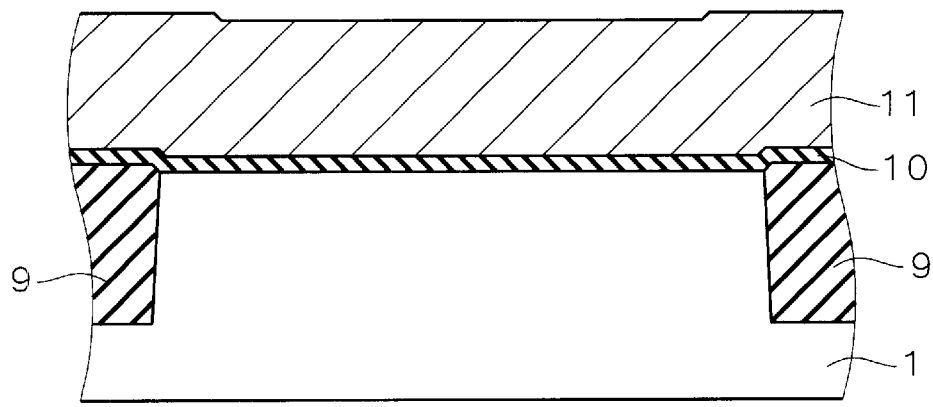
FIGS. 2 through 11 are cross-sectional views showing a method of manufacturing the semiconductor device in a step-by-step manner according to the first preferred embodiment.

FIGS. 2 through 11 are cross-sectional views showing a method of manufacturing the semiconductor device in a step-by-step manner according to the first preferred embodiment of the present invention. Initially, the isolating insulation films 9 which define the device formation region are formed in the upper surface of the silicon substrate 1, and thereafter ion implantation is performed to form a well and a doped channel region (not shown) in the upper surface of the silicon substrate 1. Then, a silicon oxide film 10 and a polysilicon film 11 are formed by deposition or the like in stacked relation in the order named on the upper surface of the silicon substrate 1 (FIG. 2).

Figure 3:
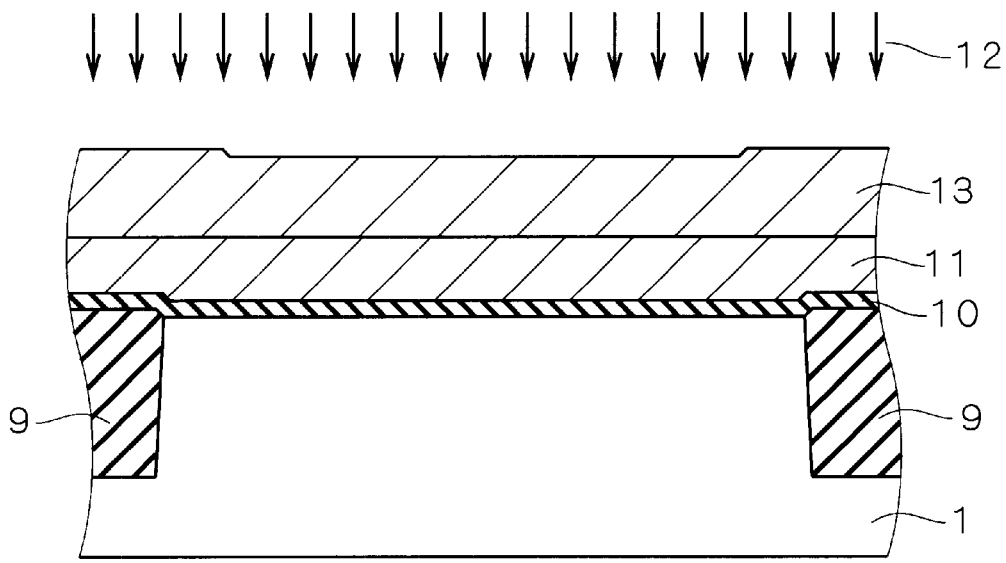

Next, ions 12 having an oxidation inhibiting effect are introduced into an upper surface of the polysilicon film 11 by an ion implantation process to form an ion-implanted layer 13 in an upper part of the polysilicon film 11 (FIG. 3). The ions 12 having the oxidation inhibiting effect used herein include, for example, nitrogen ions. The implant energy of the ions 12 should be suitably controlled so that the ions 12 are introduced into the upper surface of the polysilicon film 11.

Figure 4:
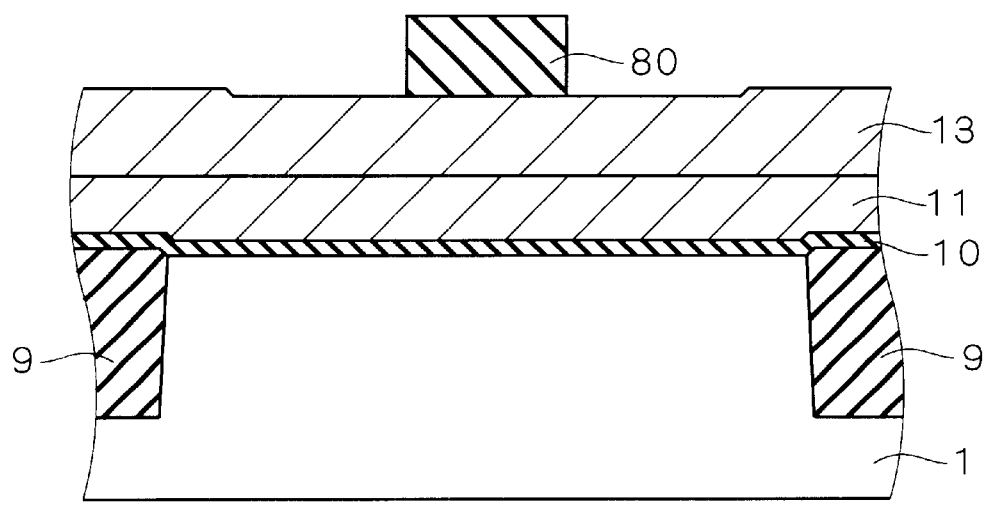

A silicon oxide film is formed on the entire surface of the resultant structure by a CVD process. A photoresist is formed by a photolithographic technique on an upper surface of the silicon oxide film over a region in which a dummy gate electrode is to be formed later. Using the photoresist as a mask, the silicon oxide film is etched to form a silicon oxide film 80. Thereafter, the photoresist is removed (FIG. 4).

Figure 5:
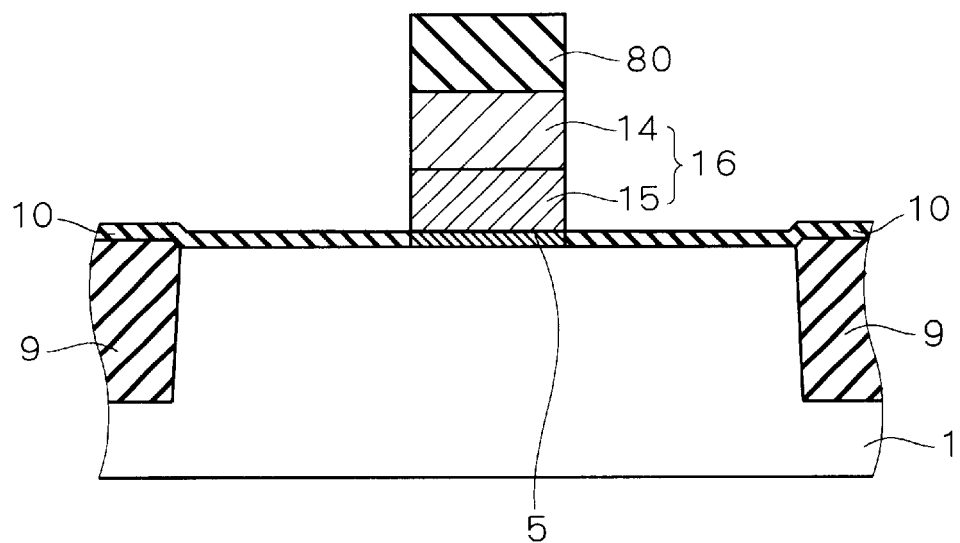

Next, using the silicon oxide film 80 as a mask, the ion-implanted layer 13 and the polysilicon film 11 are etched in the order named to expose an upper surface of the silicon oxide film 10. This provides the gate oxide film 5 formed on the upper surface of the silicon substrate 1 in the form of part of the silicon oxide film 10 which lies under the silicon oxide film 80, and a dummy gate electrode 16 formed on the gate oxide film 5 and including a polysilicon film 15 with an ion-implanted layer 14 formed thereon (FIG. 5).

Figure 6:
Figure 6:
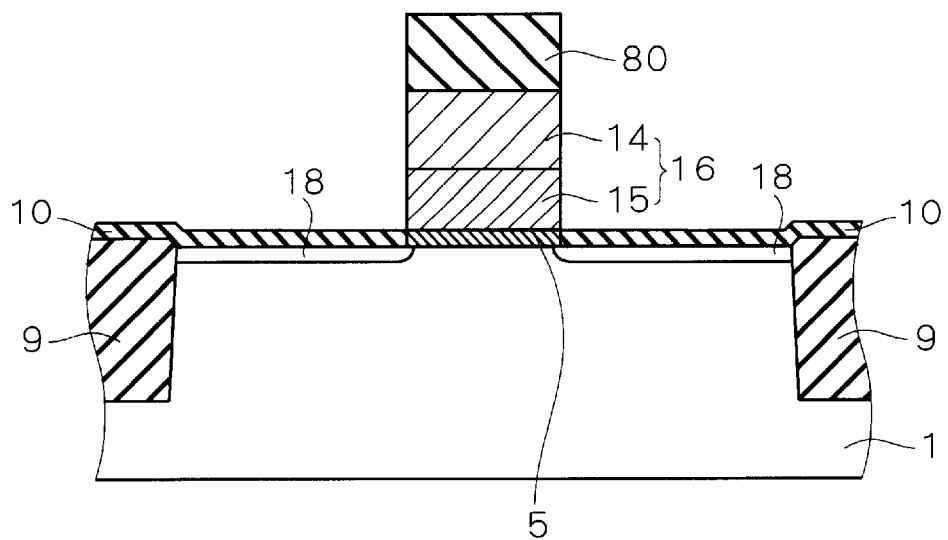
Figure 7:
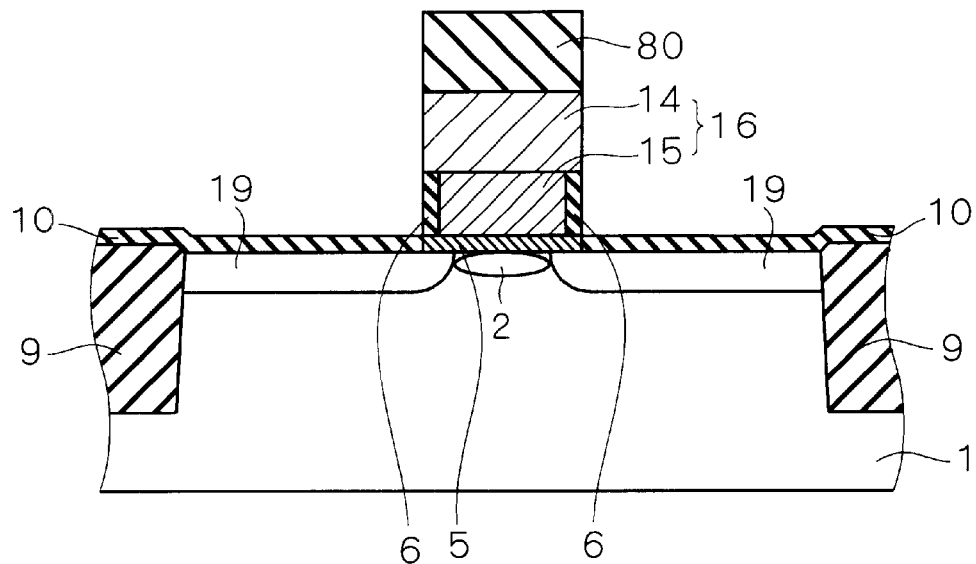

Next, using the silicon oxide film 80 as a mask, ions 17 are implanted into the upper surface of the silicon substrate 1 to form a pair of extension regions 18 (FIG. 6). Then, the dummy gate electrode 16 is thermally oxidized. In this step, the thermal oxidation reaction is retarded or inhibited from proceeding in the ion-implanted layer 14 formed in upper part of the dummy gate electrode 16. As a result, the thermal oxidation reaction proceeds at a higher rate in lower part of the dummy gate electrode 16 to form the silicon oxide films 6 in lower part of the side surfaces of the dummy gate electrode 16. In this process, the amount of oxidation may be controlled to set the width of the silicon oxide films 6 and, accordingly, the gate length at any value. For example, when the dummy gate electrode 16 having a gate length of 0.2 μm is formed in the step shown in FIG. 5, the attainment of a smaller gate length of 0.15 μm requires the reduction in gate length by 0.2–0.15=0.05 μm. In this case, the amount of oxidation should be controlled so that the silicon oxide films 6 formed in the lower part of the side surfaces of the dummy gate electrode 16 have a width of 0.025 μm. Additionally, this step causes the impurity in the extension regions 18 to thermally diffuse, changing the extension regions 18 into a pair of extension diffusion regions 19. A region lying between the extension diffusion regions 19 in the upper surface of the silicon substrate 1 is defined as the channel region 2 (FIG. 7).

Figure 8:
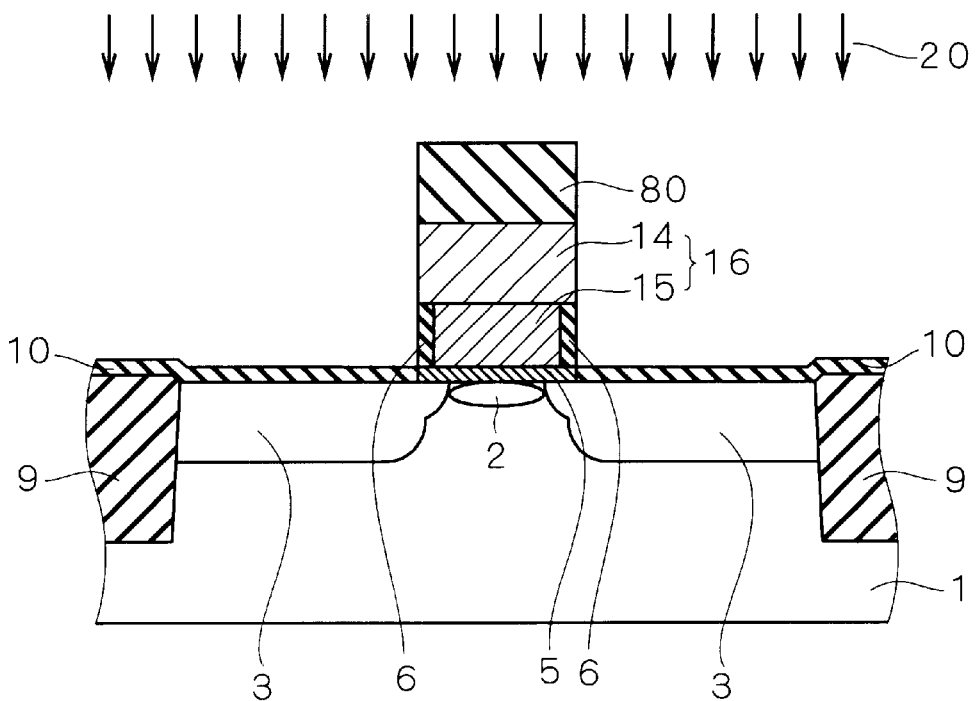
Figure 9:
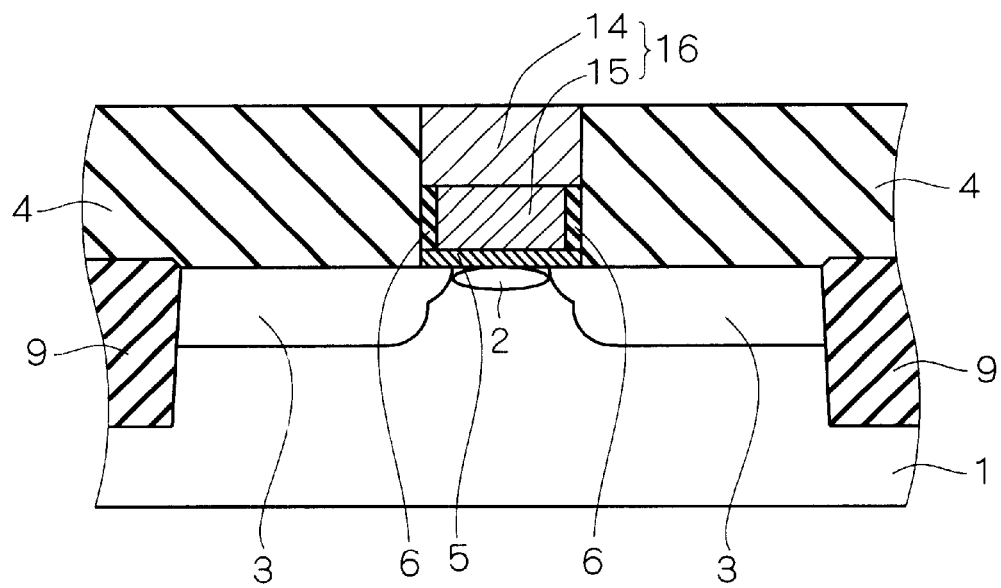
Figure 10:
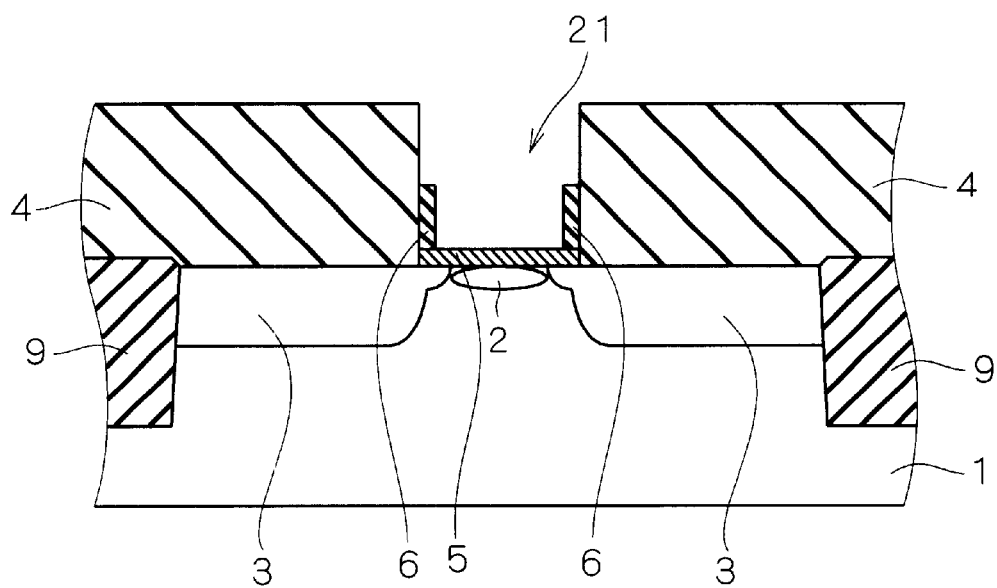

Next, using the silicon oxide film 80 as a mask, ions 20 are implanted into the upper surface of the silicon substrate 1 to a position deeper than the extension diffusion regions 19, thereby forming the source/drain regions 3 (FIG. 8). Then, a silicon oxide film having a thickness not less than that of the dummy gate electrode 16 is deposited on the entire surface of the resultant structure. Subsequently, the deposited silicon oxide film and the silicon oxide film 80 are polished by a CMP process until an upper surface of the dummy gate electrode 16 is exposed, to form the pair of silicon oxide films 4. Parts of the silicon oxide film 10 formed on the upper surface of the silicon substrate 1 which overlie the source/drain regions 3 become parts of the silicon oxide films 4 (FIG. 9).

Next, polysilicon etching is performed under conditions of high selectivity to silicon oxide. This removes the dummy gate electrode 16 while leaving the silicon oxide films 6, to form a recess 21 surrounded by the upper part of the side surfaces of the silicon oxide films 4, the silicon oxide films 6 and the gate oxide film 5 (FIG. 10) the recess 21 can be formed, provided that the silicon oxide film deposited on the entire surface of the structure shown in FIG. 8 has a thickness greater than the height of the silicon oxide films 6.

Figure 11:
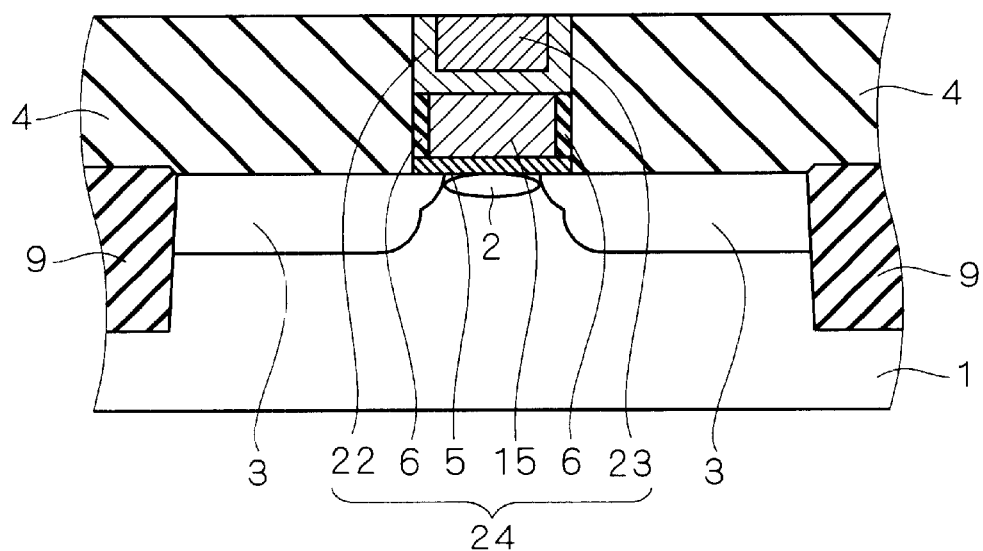

Then, the metal film 7 is deposited on the entire surface of the resultant structure so as to fill the recess 21, and is polished by a CMP process until an upper surface of the silicon oxide films 4 is exposed. This provides the structure shown in FIG. 1. In this process, a barrier metal may be formed which serves as an underlying layer of the metal film 7. An alternative to the step shown in FIG. 10 may include removing only the ion-implanted layer 14, rather than removing the dummy gate electrode 16 entirely, and forming a barrier metal 22 and a metal film 23 so as to fill a recess surrounded by the upper part of the side surfaces of the silicon oxide films 4 and an upper surface of the polysilicon film 15 (FIG. 11). After the steps of forming an interlayer insulation film and forming an interconnect line and the like, the device is completed.

As described hereinabove, the method of manufacturing the semiconductor device according to the first preferred embodiment provides the metal film 7 functioning as the gate electrode such that the length L2 (gate length) of the lower part thereof is less than the length L1 of the upper part thereof. Therefore, the first preferred embodiment attains the gate length less than the exposure limit of the photolithographic technique when the exposure limit equals the length L1, consequently to increase the operating speed of the MOSFET and improve the high frequency characteristic thereof without decreasing the driving capability thereof.

Second Preferred Embodiment

Figure 12:
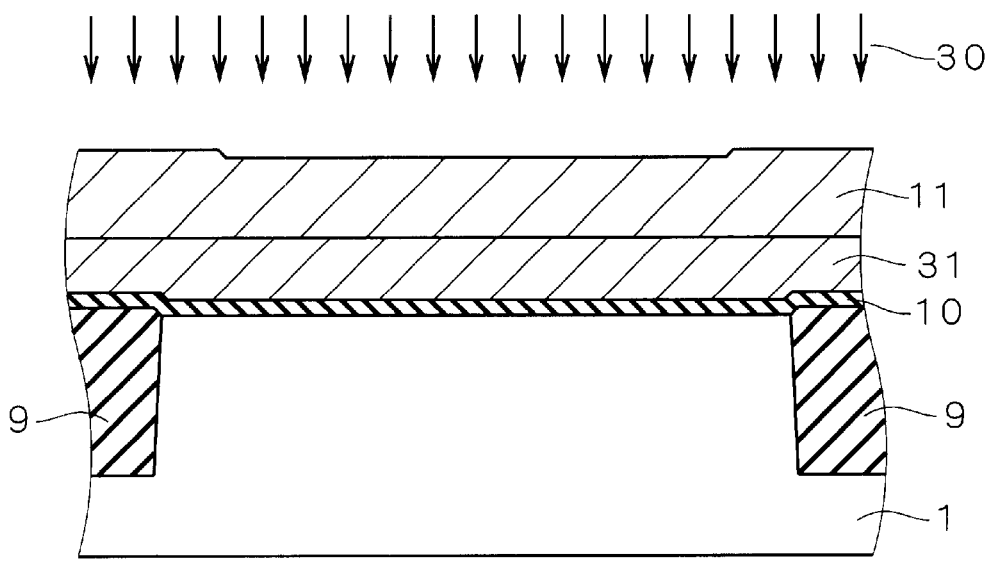
FIGS. 12 through 15 are cross-sectional views showing the method of manufacturing the semiconductor device in a step-by-step manner according to a second preferred embodiment of the present invention.

FIGS. 12 through 15 are cross-sectional views showing the method of manufacturing the semiconductor device in a step-by-step manner according to a second preferred embodiment of the present invention. Initially, a structure similar to the structure of FIG. 2 is prepared in a manner similar to that of the first preferred embodiment. Next, ions 30 having an oxidation promoting effect are introduced into a lower surface of the polysilicon film 11 by an ion implantation technique to form an ion-implanted layer 31 in lower part of the polysilicon film 11 (FIG. 12). The ions 30 having the oxidation promoting effect used herein include, for example, oxygen ions and argon ions. The implant energy of the ions 30 should be suitably controlled so that the ions 30 are introduced into the lower surface of the polysilicon film 11.

Figure 13:
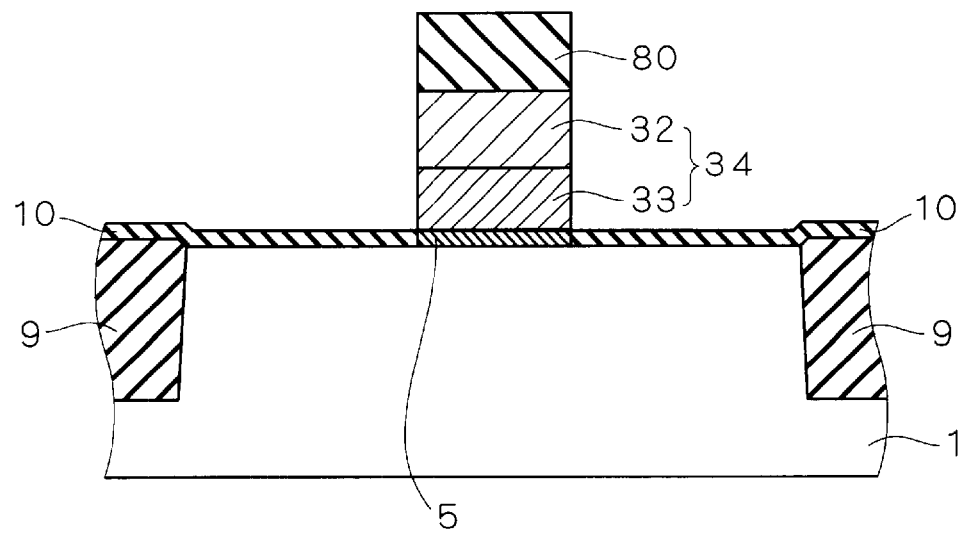

In a manner similar to that of the first preferred embodiment, the silicon oxide film 80 is formed on the upper surface of the polysilicon film 11 over a region in which a dummy gate electrode is to be formed later. Then, using the silicon oxide film 80 as a mask, the polysilicon film 11 and the ion-implanted layer 31 are etched in the order named to expose the upper surface of the silicon oxide film 10. This provides the gate oxide film 5 selectively formed on the upper surface of the silicon substrate 1, and a dummy gate electrode 34 formed on the gate oxide film 5 and including a polysilicon film 32 with an ion-implanted layer 33 formed therebeneath (FIG. 13).

Figure 14:
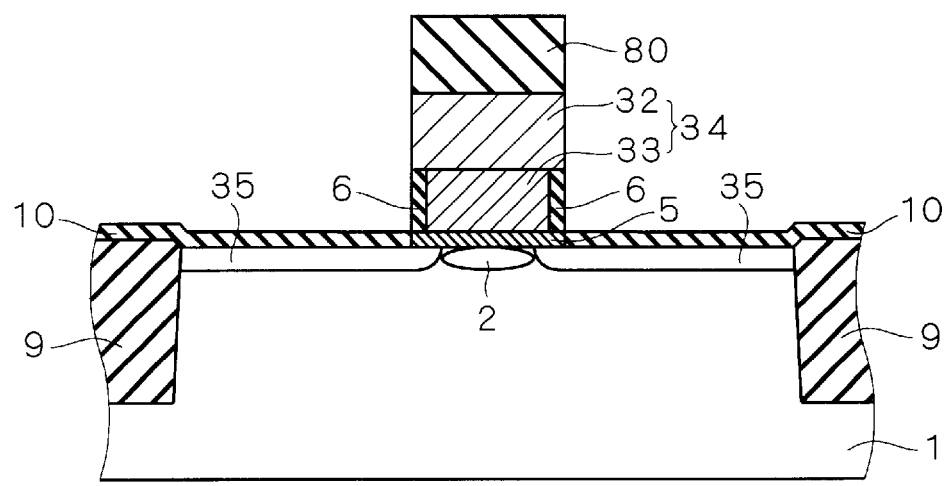

Next, the extension regions 18 are formed in the upper surface of the silicon substrate 1 in a manner similar to that of the first preferred embodiment. Then, the dummy gate electrode 34 is thermally oxidized. In this step, the thermal oxidation reaction is promoted in the ion-implanted layer 33 formed in lower part of the dummy gate electrode 34. As a result, the thermal oxidation reaction proceeds at a higher rate in the lower part of the dummy gate electrode 34 to form the silicon oxide films 6 in lower part of the side surfaces of the dummy gate electrode 34. Additionally, this step causes the impurity in the extension regions 18 to thermally diffuse, changing the extension regions 18 into a pair of extension diffusion regions 35. A region lying between the extension diffusion regions 35 in the upper surface of the silicon substrate 1 is defined as the channel region 2 (FIG. 14).

Figure 15:
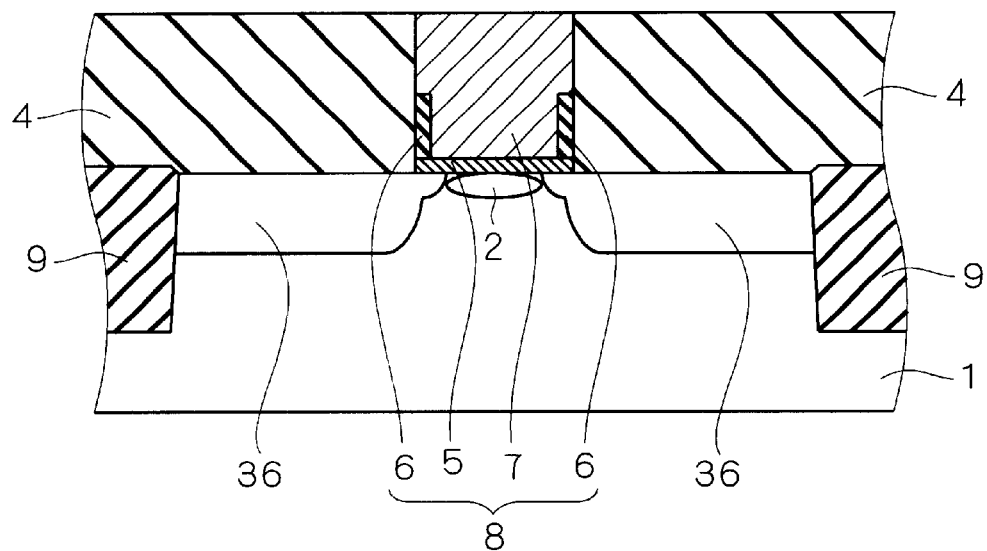

Next, in a manner similar to that of the first preferred embodiment, a pair of source/drain regions 36 are formed in the upper surface of the silicon substrate 1, and thereafter the silicon oxide films 4 are formed on the upper surface of the silicon substrate 1. Polysilicon etching is performed under conditions of high selectivity to silicon oxide, to remove the dummy gate electrode 34 while leaving the silicon oxide films 6. Then, a recess surrounded by the upper part of the side surfaces of the silicon oxide films 4, the silicon oxide films 6 and the gate oxide film 5 is filled with the metal film 7 (FIG. 15). After the steps of forming an interlayer insulation film and forming an interconnect line and the like, the device is completed.

Thus, the method of manufacturing the semiconductor device according to the second preferred embodiment produces an effect similar to that produced by the method of the first preferred embodiment and yet the following additional effect. The reduction in effective oxidation time for the formation of the silicon oxide films 6 prevents the impurity in the extension regions 18 from being excessively thermally diffused.

Third Preferred Embodiment

Figure 16:
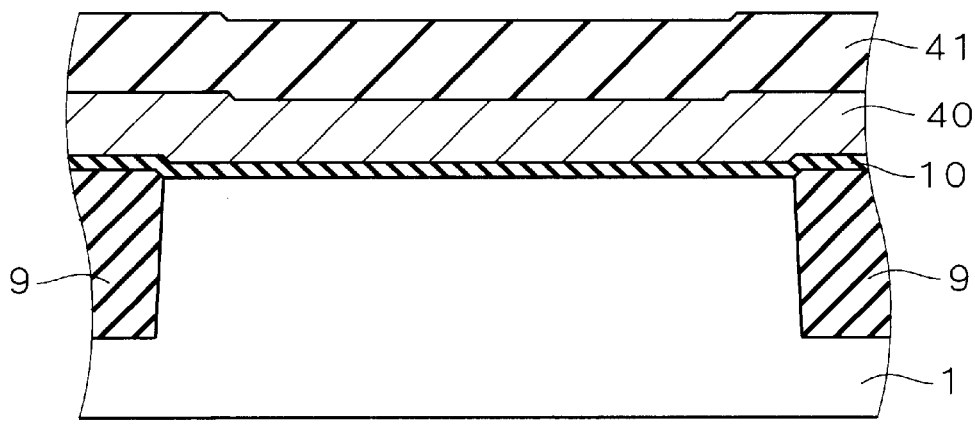
FIGS. 16 through 19 are cross-sectional views showing the method of manufacturing the semiconductor device in a step-by-step manner according to a third preferred embodiment of the present invention.

FIGS. 16 through 19 are cross-sectional views showing the method of manufacturing the semiconductor device in a step-by-step manner according to a third preferred embodiment of the present invention. Initially, the isolating insulation films 9 which define the device formation region are formed in the upper surface of the silicon substrate 1, and thereafter ion implantation is performed to form a well and a doped channel region (not shown) in the upper surface of the silicon substrate 1. Then, the silicon oxide film 10, a polysilicon film 40 and a silicon nitride film 41 are formed by deposition or the like in stacked relation in the order named on the upper surface of the silicon substrate 1 (FIG. 16).

Figure 17:
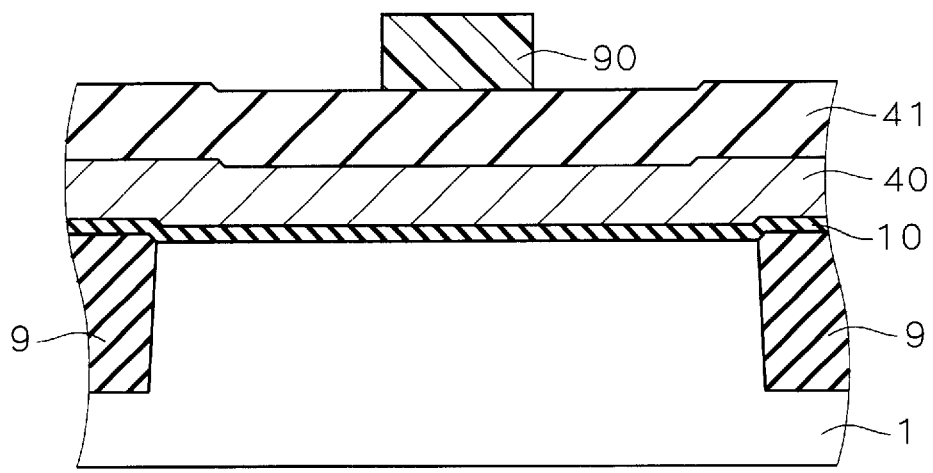
Figure 18:
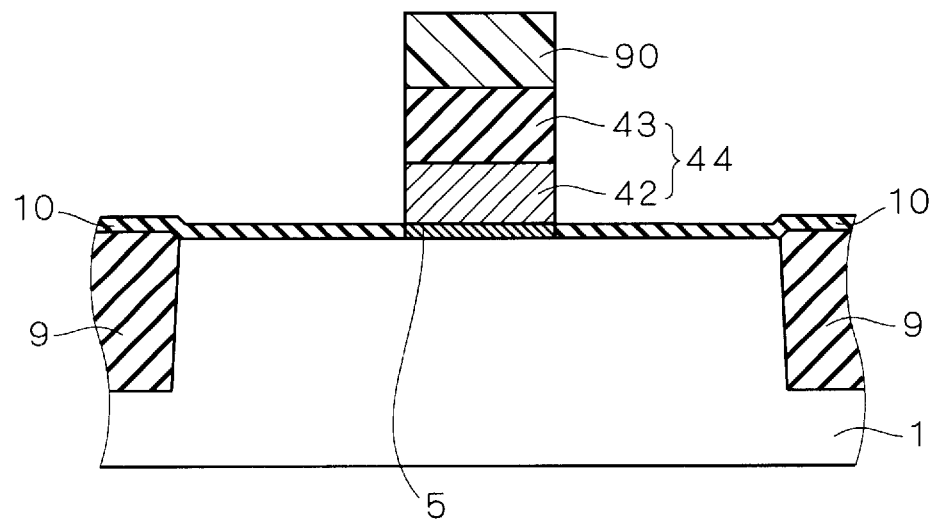

A photoresist 90 is formed by a photolithographic technique on an upper surface of the silicon nitride film 41 over a region in which a dummy gate electrode is to be formed later (FIG. 17). Using the photoresist 90 as a mask, the silicon nitride film 41 and the polysilicon film 40 are continuously etched in the order named to expose the upper surface of the silicon oxide film 10. This provides the gate oxide film 5 selectively formed on the upper surface of the silicon substrate 1, and a dummy gate electrode 44 formed on the gate oxide film 5 and having a multilayer structure including a polysilicon film 42 and a silicon nitride film 43 stacked in the order named (FIG. 18).

Figure 19:
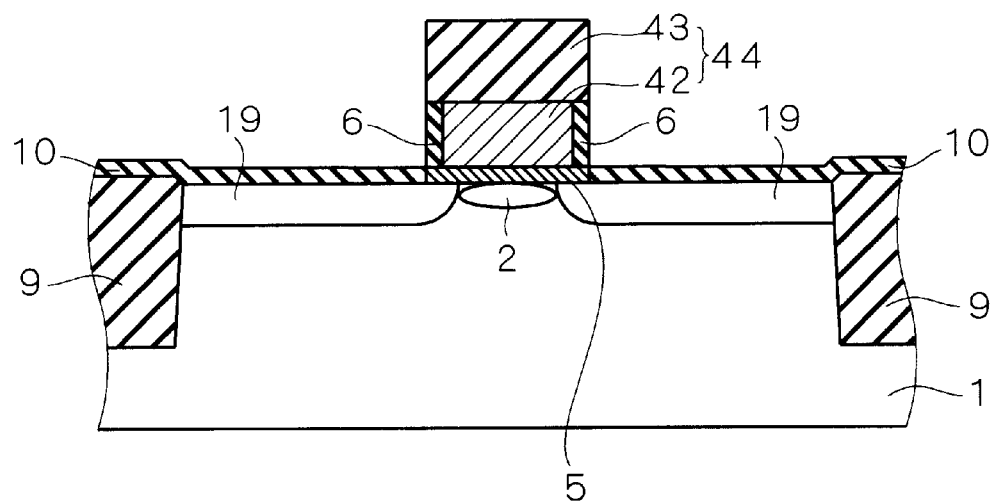

After the photoresist 90 is removed, the extension regions 18 are formed in the upper surface of the silicon substrate 1 in a manner similar to that of the first preferred embodiment. Then, the dummy gate electrode 44 is thermally oxidized. In this step, the upper part of the dummy gate electrode 44 is comprised of the silicon nitride film 43 and therefore is hardly thermally oxidized as compared with the lower part thereof. As a result, only the polysilicon film 42 in the lower part of the dummy gate electrode 44 is substantially thermally oxidized, thereby forming the silicon oxide films 6 in lower part of the side surfaces of the dummy gate electrode 44. Additionally, this step causes the impurity in the extension regions 18 to thermally diffuse, changing the extension regions 18 into the pair of extension diffusion regions 19. The region lying between the extension diffusion regions 19 in the upper surface of the silicon substrate 1 is defined as the channel region 2 (FIG. 19).

Next, in a manner similar to that of the first preferred embodiment, the source/drain regions 3 are formed in the upper surface of the silicon substrate 1, and thereafter the silicon oxide films 4 are formed on the upper surface of the silicon substrate 1. Then, the dummy gate electrode 44 is removed while the silicon oxide films 6 are left. A recess surrounded by the upper part of the side surfaces of the silicon oxide films 4, the silicon oxide films 6 and the gate oxide film 5 is filled with the metal film 7. This provides a structure similar to that shown in FIG. 1. After the steps of forming an interlayer insulation film and forming an interconnect line and the like, the device is completed.

Thus, the method of manufacturing the semiconductor device according to the third preferred embodiment produces an effect similar to that produced by the method of the first preferred embodiment and yet the following additional effects. In the step shown in FIG. 19, the silicon nitride film 43 is thermally oxidized less than the upper parts of the dummy gate electrodes 16 and 34 of the first and second preferred embodiments. Therefore, the gate length of the upper part of the gate electrode comprised of the metal film 7 is more precisely and easily set as the length of the silicon nitride film 43. Additionally, the thickness of the upper part of the gate electrode is more precisely and easily set as the thickness of the silicon nitride film 43. Consequently, the semiconductor device and the method of manufacturing the same according to the third preferred embodiment can set the value of the gate resistance more precisely and easily than those of the first and second preferred embodiments.

Further, in the step shown in FIG. 18, the silicon nitride film 41 and the polysilicon film 40 are continuously etched, using the photoresist 90 selectively formed on the silicon nitride film 41 as a mask. This simplifies the manufacturing steps, as compared with the method of manufacturing the semiconductor device according to a modification of the third preferred embodiment or a fourth preferred embodiment to be described later which comprises the steps of selectively forming a silicon oxide film or a silicon nitride film on a polysilicon film and etching the polysilicon film, using the silicon oxide film or the silicon nitride film as a mask.

Figure 20:
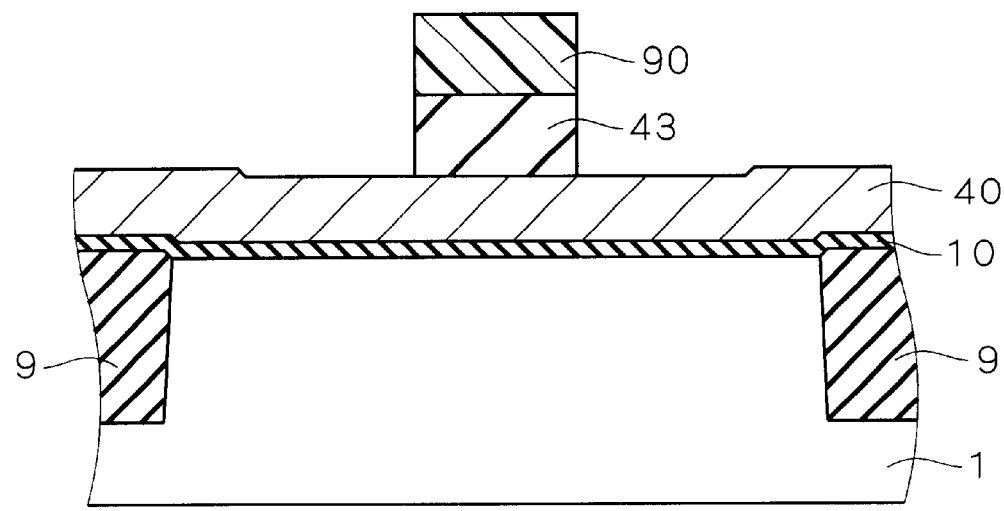
FIGS. 20 and 21 are cross-sectional views showing the method of manufacturing the semiconductor device in a step-by-step manner according to a modification of the third preferred embodiment.
Figure 21:
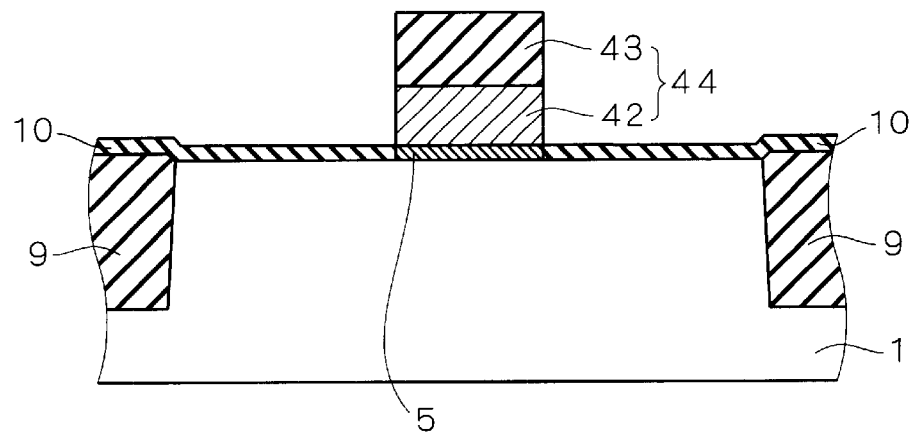

FIGS. 20 and 21 are cross-sectional views showing the method of manufacturing the semiconductor device in a step-by-step manner according to a modification of the third preferred embodiment. In the step shown in FIG. 18, the silicon nitride film 41 and the polysilicon film 40 are continuously etched, using the photoresist 90 as a mask. An alternative to the step shown in FIG. 18 may be performed in the following manner. First, using the photoresist 90 as mask, the silicon nitride film 41 is etched to expose an upper surface of the polysilicon film 40 (FIG. 20). Next, the photoresist 90 is removed. Thereafter, using the silicon nitride film 43 as a mask, the polysilicon film 40 is etched to expose the upper surface of the silicon oxide film 10 (FIG. 21). Thus, in the method of manufacturing the semiconductor device according to the modification of the third preferred embodiment, the dummy gate electrode 44 is formed by individually etching the silicon nitride film 41 and the polysilicon film 40 in different steps, rather than continuously etching the silicon nitride film 41 and the polysilicon film 40. This individual etching process requires a smaller etch amount in each of the steps than the process of continuously etching the silicon nitride film 41 and the polysilicon film 40, thereby facilitating etching control.

Fourth Preferred Embodiment

Figure 22:
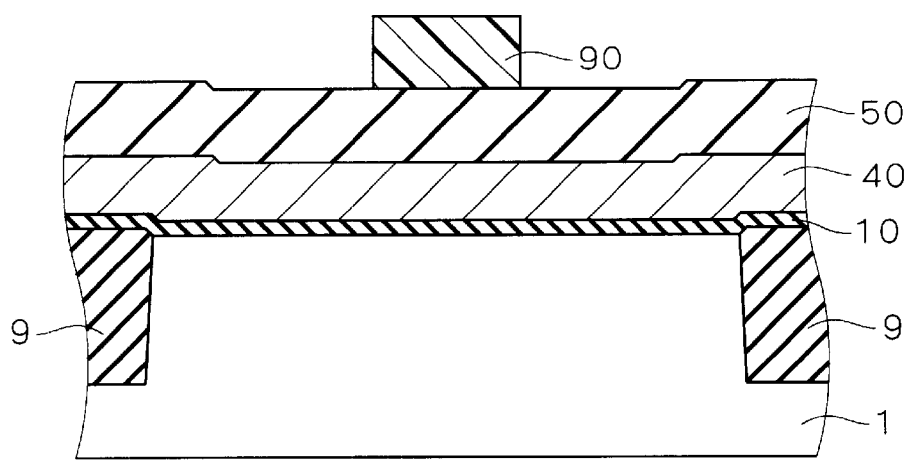
FIGS. 22 through 25 are cross-sectional views showing the method of manufacturing the semiconductor device in a step-by-step manner according to a fourth preferred embodiment of the present invention.
Figure 23:
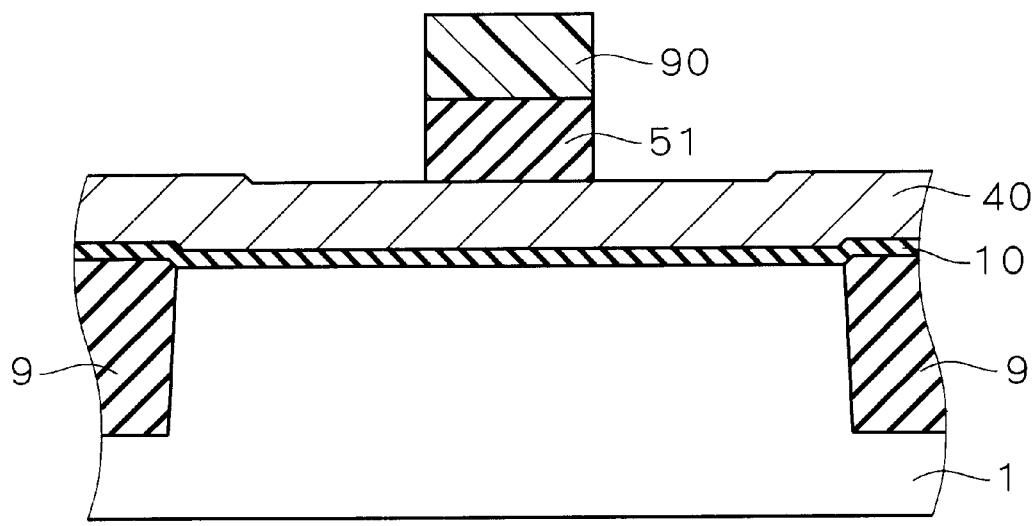

FIGS. 22 through 25 are cross-sectional views showing the method of manufacturing the semiconductor device in a step-by-step manner according to a fourth preferred embodiment of the present invention. Initially, the isolating insulation films 9 are formed in the upper surface of the silicon substrate 1, and thereafter ion implantation is performed to form a well and a doped channel region (not shown) in the upper surface of the silicon substrate 1. Then, the silicon oxide film 10, the polysilicon film 40 and a silicon oxide film 50 are formed by deposition or the like in stacked relation in the order named on the upper surface of the silicon substrate 1. The photoresist 90 is formed by a photolithographic technique on an upper surface of the silicon oxide film 50 over a region in which a dummy gate electrode is to be formed later (FIG. 22). Using the photoresist 90 as a mask, the silicon oxide film 50 is etched to expose the upper surface of the polysilicon film 40. This provides a silicon oxide film 51 remaining as unetched part of the silicon oxide film 50 (FIG. 23).

Figure 24:
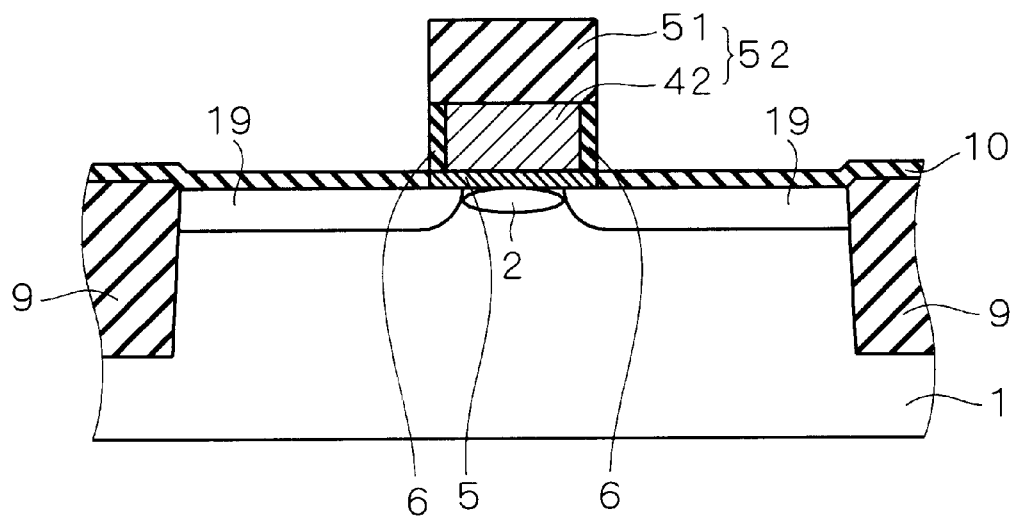

After the photoresist 90 is removed, the polysilicon film 40 is etched, using the silicon oxide film 51 as a mask, to expose the upper surface of the silicon oxide film 10. This provides a polysilicon film 42 remaining as unetched part of the polysilicon film 40. As a result, the gate oxide film 5 is selectively formed on the upper surface of the silicon substrate 1, and a dummy gate electrode 52 having a multilayer structure including the polysilicon film 42 and the silicon oxide film 51 stacked in the order named is formed on the gate oxide film 5. Thereafter, the extension regions 18 are formed in the upper surface of the silicon substrate 1 in a manner similar to that of the first preferred embodiment. Then, the dummy gate electrode 52 is thermally oxidized. In this step, the upper part of the dummy gate electrode 52 is comprised of the silicon oxide film 51 and therefore is hardly thermally oxidized as compared with the lower part thereof. As a result, only the polysilicon film 42 in the lower part of the dummy gate electrode 52 is substantially thermally oxidized, thereby forming the silicon oxide films 6 in lower part of the side surfaces of the dummy gate electrode 52. Additionally, this step causes the impurity in the extension regions 18 to thermally diffuse, changing the extension regions 18 into the pair of extension diffusion regions 19. The region lying between the extension diffusion regions 19 in the upper surface of the silicon substrate 1 is defined as the channel region 2 (FIG. 24).

Figure 25:
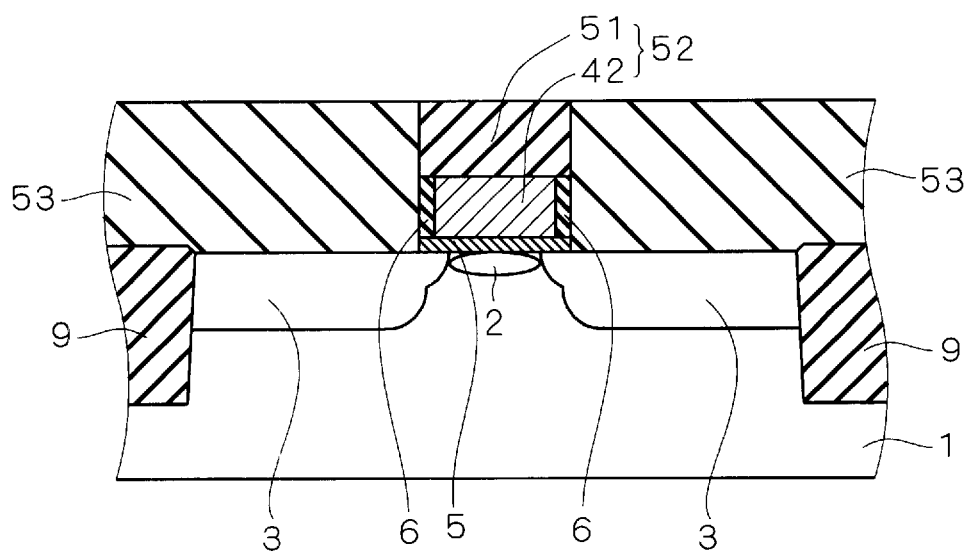

Next, in a manner similar to that of the first preferred embodiment, the source/drain regions 3 are formed in the upper surface of the silicon substrate 1. Then, a silicon nitride film having a thickness not less than that of the dummy gate electrode 52 is deposited on the entire surface of the resultant structure, and is polished by a CMP process until an upper surface of the dummy gate electrode 52 is exposed, thereby forming a pair of silicon nitride films 53 (FIG. 25). The silicon oxide film 10 is not shown in FIG. 25 since the silicon oxide film 10 has a thickness much smaller than the thickness of the silicon nitride films 53 and serves as an interlayer insulation film as well as the silicon nitride films 53.

The dummy gate electrode 52 is removed while the silicon oxide films 6 are left. More specifically, the silicon oxide film 51 is removed by etching until an upper surface of the polysilicon film 42 is exposed, and then the etching is once suspended. Thereafter, the polysilicon film 42 is removed by etching until the gate oxide film 5 is exposed. Next, a recess surrounded by upper part of side surfaces of the silicon nitride films 53, the silicon oxide films 6 and the gate oxide film 5 is filled with the metal film 7. After the steps of forming an interlayer insulation film and forming an interconnect line and the like, the device is completed. The recess can be formed, provided that the silicon nitride film deposited on the entire surface of the structure shown in FIG. 24 has a thickness greater than the height of the silicon oxide films 6.

Thus, the method of manufacturing the semiconductor device according to the fourth preferred embodiment produces effects similar to those produced by the method of the first and third preferred embodiments and yet the following additional effect. In the method of the third preferred embodiment, the silicon nitride film 43 is used as a mask to etch the polysilicon film 40. However, since silicon nitride generally has a lower selectivity to polysilicon than does silicon oxide, the silicon nitride film 43 is susceptible to etching in the step of etching the polysilicon film 40. This requires the previous formation of the silicon nitride film 41 having a thickness greater than a thickness to be established based on the height of the dummy gate electrode 44, and the etching of the silicon nitride film 41 by a greater amount for the formation of the silicon nitride film 43. On the other hand, in the method of the fourth preferred embodiment, the silicon oxide film 51 having a higher selectivity to polysilicon than does silicon nitride is used as a mask to etch the polysilicon film 40. Thus, the silicon oxide film 50 need not be as thick as the silicon nitride film 41, and the silicon oxide film 50 is etched by a smaller amount. Consequently, the method of manufacturing the semiconductor device according to the fourth preferred embodiment can produce the effect of controlling the etching of the silicon oxide film 50 more easily than can the method of the third preferred embodiment.

Fifth Preferred Embodiment

Figure 26:
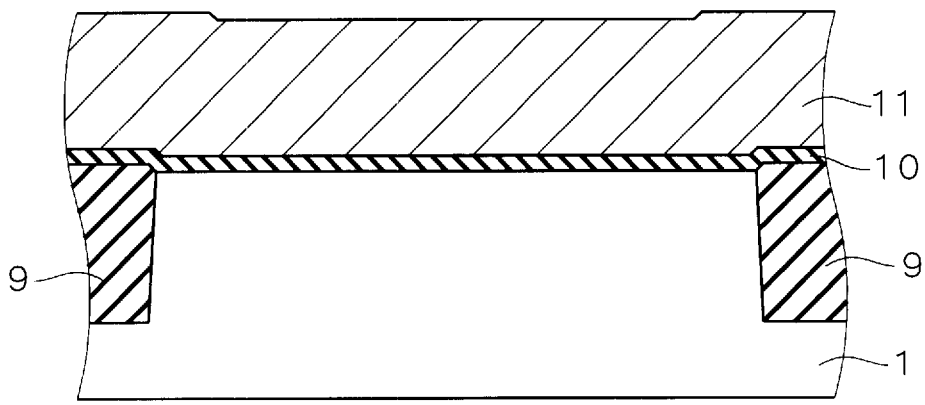
FIGS. 26 through 33 are cross-sectional views showing the method of manufacturing the semiconductor device in a step-by-step manner according to a fifth preferred embodiment of the present invention.

FIGS. 26 through 33 are cross-sectional views showing the method of manufacturing the semiconductor device in a step-by-step manner according to a fifth preferred embodiment of the present invention. Initially, the isolating insulation films 9 are formed in the upper surface of the silicon substrate 1, and thereafter ion implantation is performed to form a well (not shown) in the upper surface of the silicon substrate 1. Then, the silicon oxide film 10 and the polysilicon film 11 are formed by deposition or the like in stacked relation in the order named on the upper surface of the silicon substrate 1 (FIG. 26).

Figure 27:
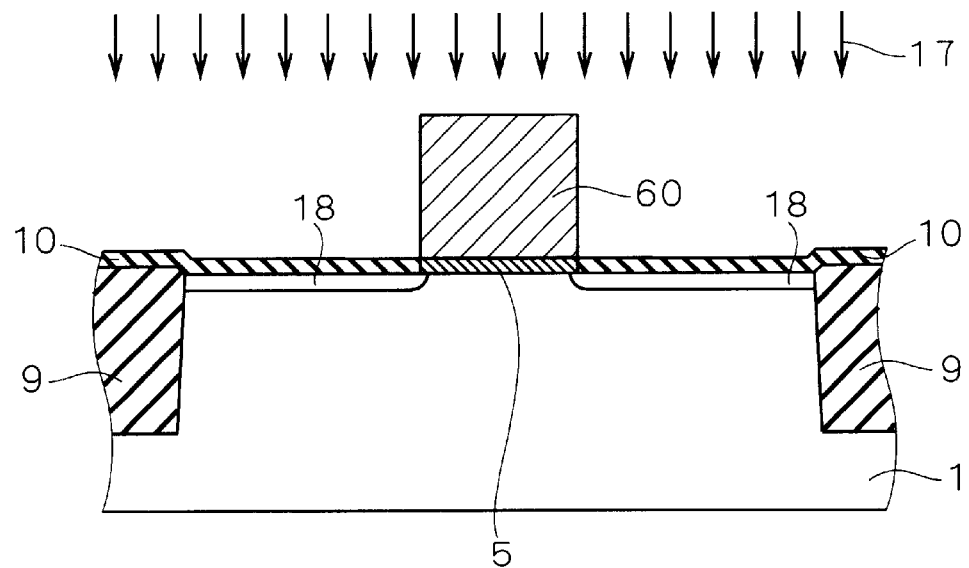

Next, a photoresist is formed by a photolithographic technique on the upper surface of the polysilicon film 11 over a region in which a dummy gate electrode is to be formed later. Using the photoresist as a mask, the polysilicon film 11 is etched to expose the upper surface of the silicon oxide film 10. Then, the photoresist is removed. This provides the gate oxide film 5 selectively formed on the upper surface of the silicon substrate 1, and a dummy gate electrode 60 formed on the gate oxide film 5 and made of polysilicon. Thereafter, using the dummy gate electrode 60 as a mask, the ions 17 are implanted into the upper surface of the silicon substrate 1 to form the extension regions 18 (FIG. 27).

Figure 28:
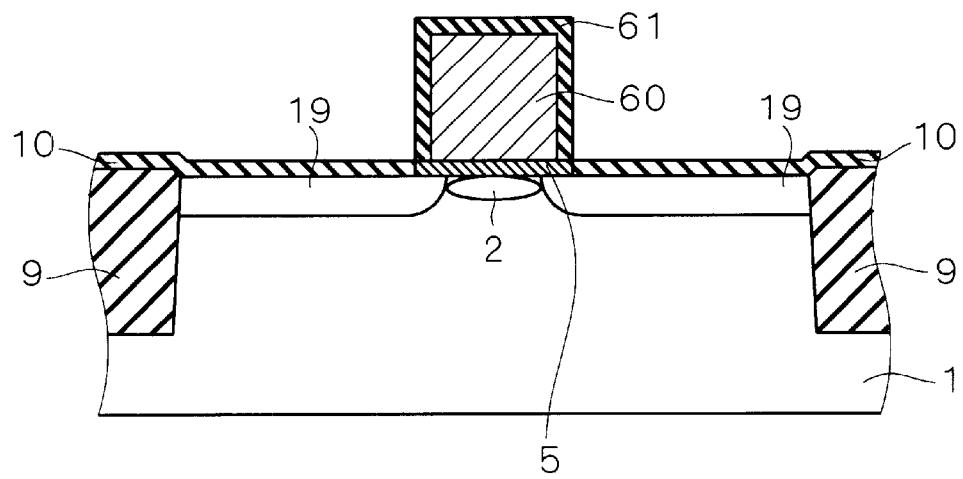

The surface of the dummy gate electrode 60 is thermally oxidized to form a silicon oxide film 61. Additionally, this step causes the impurity in the extension regions 18 to thermally diffuse, changing the extension regions 18 into the pair of extension diffusion regions 19. The region lying between the extension diffusion regions 19 in the upper surface of the silicon substrate 1 is defined as the channel region 2 (FIG. 28).

Figure 29:
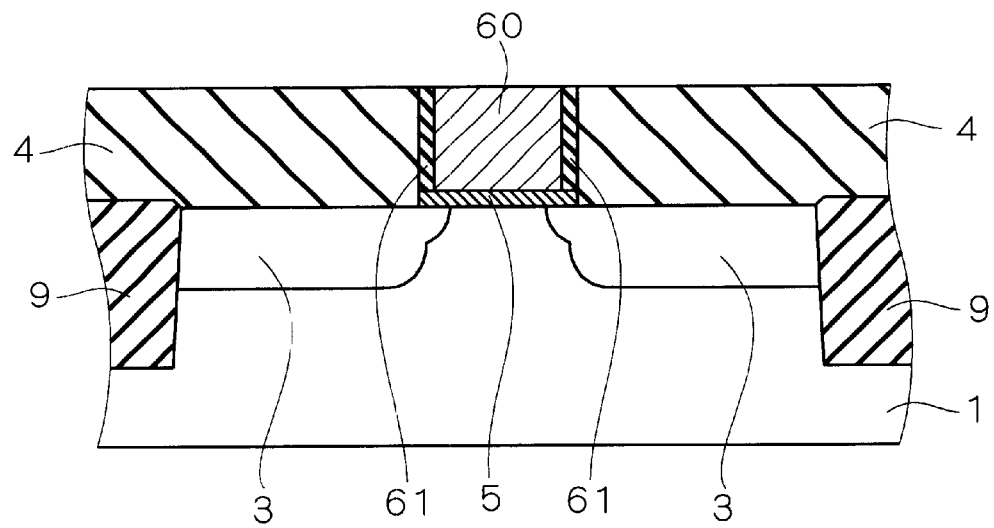
Figure 30:
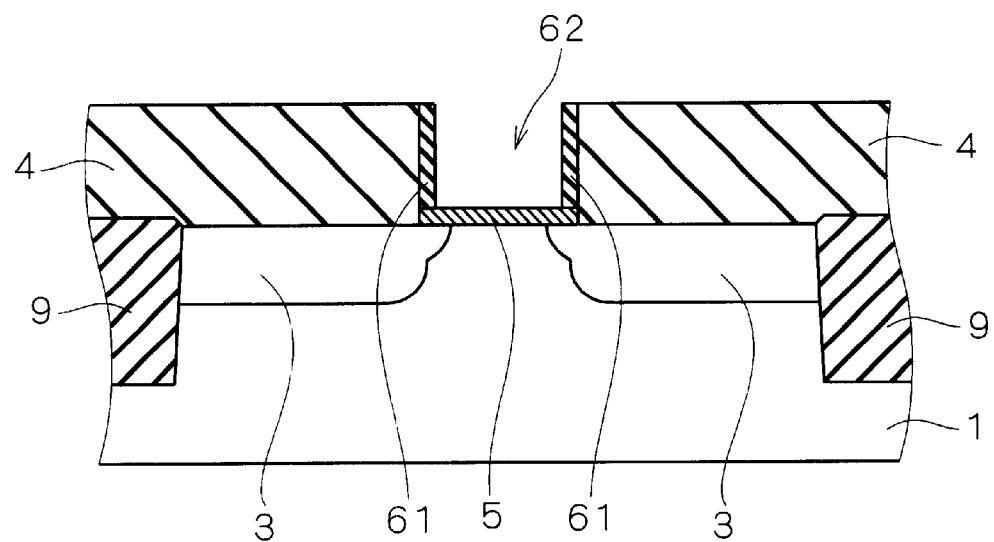

Next, using the dummy gate electrode 60 as a mask, ions are implanted into the upper surface of the silicon substrate 1 to form the source/drain regions 3. Then, a silicon oxide film having a thickness not less than that of the dummy gate electrode 60 is deposited on the entire surface of the resultant structure. The silicon oxide film and the dummy gate electrode 60 are polished by a CMP process until upper part of the dummy gate electrode 52 is partially removed. This provides the silicon oxide films 4 formed on the upper surface of the silicon substrate 1, and also removes part of the silicon oxide film 61 from the upper surface of the dummy gate electrode 60 to leave parts of the silicon oxide film 61 which are formed in the side surfaces thereof (FIG. 29). The dummy gate electrode 60 is removed by etching while the silicon oxide films 61 are left, to form a recess 62 surrounded by the silicon oxide films 61 and the gate oxide film 5 (FIG. 30).

Figure 31:
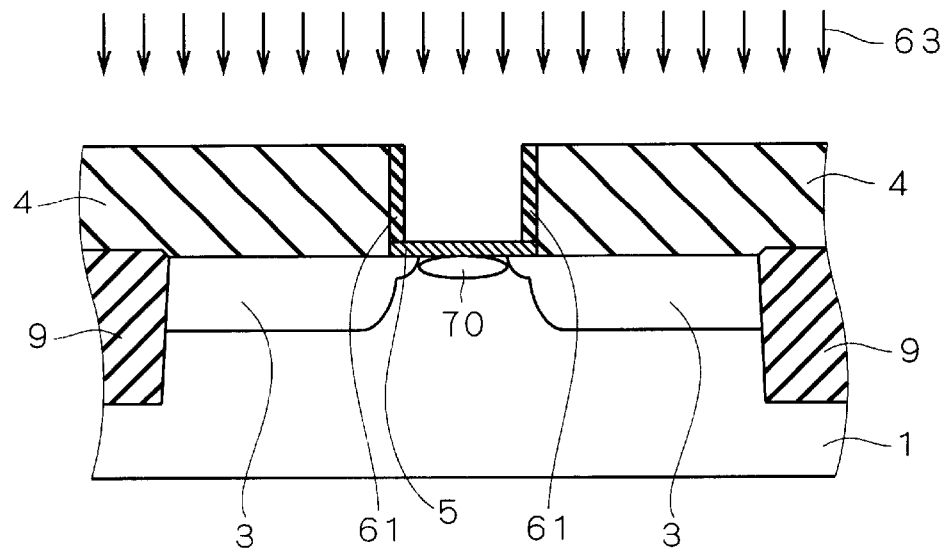
Figure 32:
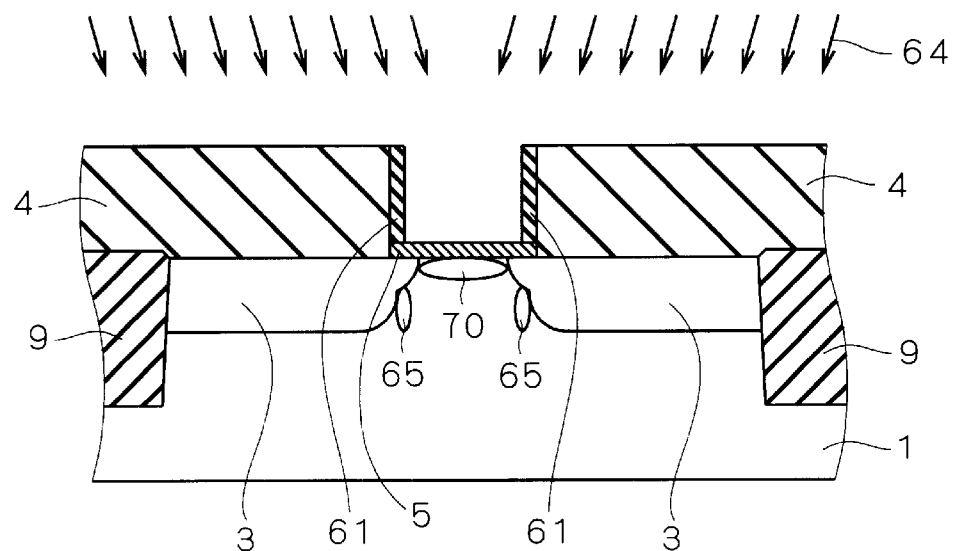

Next, ions 63 are implanted through the gate oxide film 5 into the upper surface of the silicon substrate 1 to form a doped channel region 70 (FIG. 31). The ion implantation in this step is performed in a direction parallel to the normal to the upper surface of the silicon substrate 1. Next, ions 64 are implanted through the gate oxide film 5 into the silicon substrate 1 to form a pair of pocket regions 65 (FIG. 32). The ion implantation in this step is performed preferably at an angle ranging from about 5 to about 15 degrees with respect to the normal to the upper surface of silicon substrate 1 in view of the conditions that the pocket regions 65 are to be located near the confronting ends of the pair of source/drain regions 3, respectively.

Figure 33:
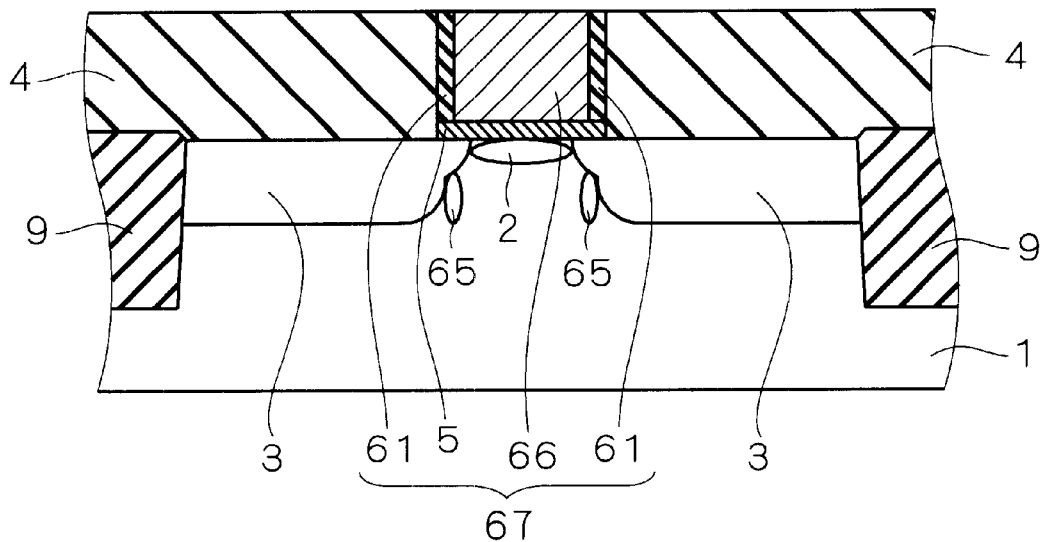
Figure 34:
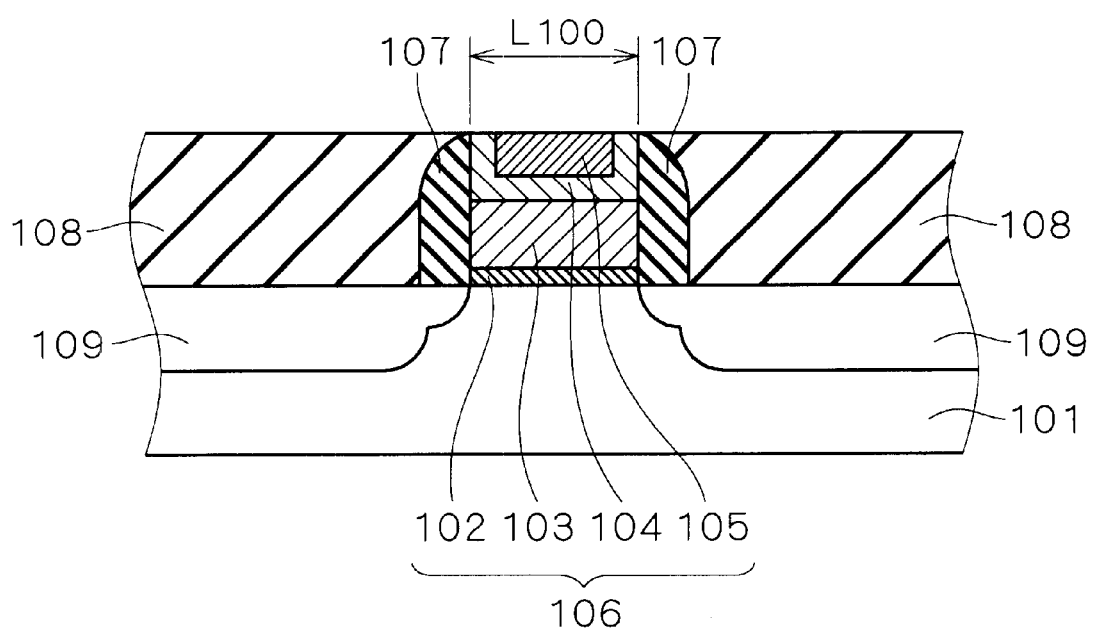
FIG. 34 is a cross-sectional view of a background art semiconductor device.
Figure 35:
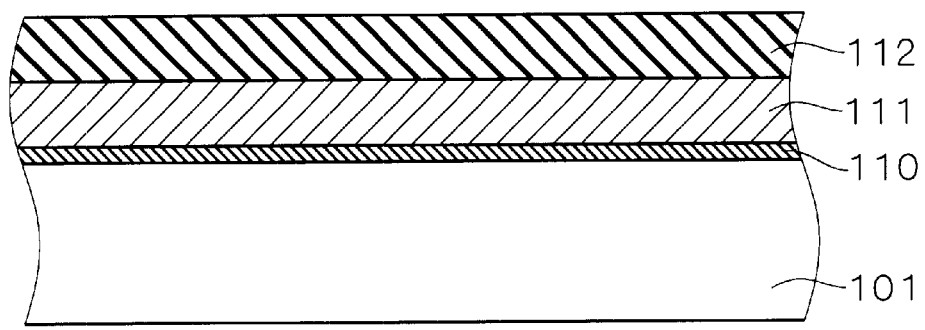
FIGS. 35 through 41 are cross-sectional views showing a method of manufacturing the background art semiconductor device.
Figure 36:
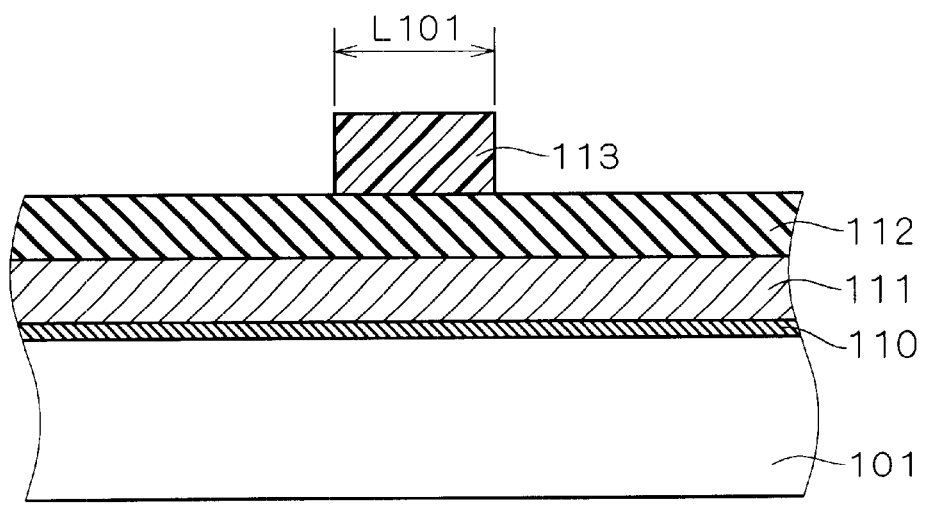
Figure 37:
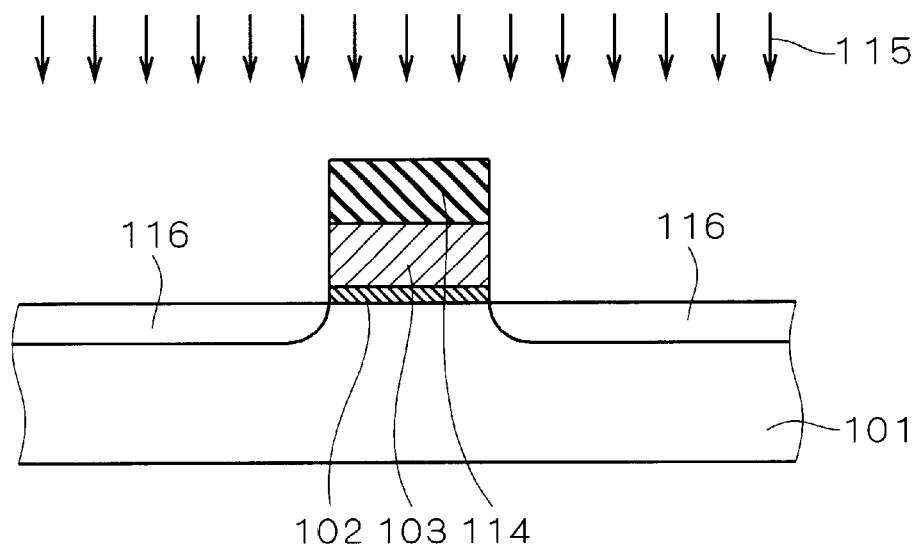
Figure 38:
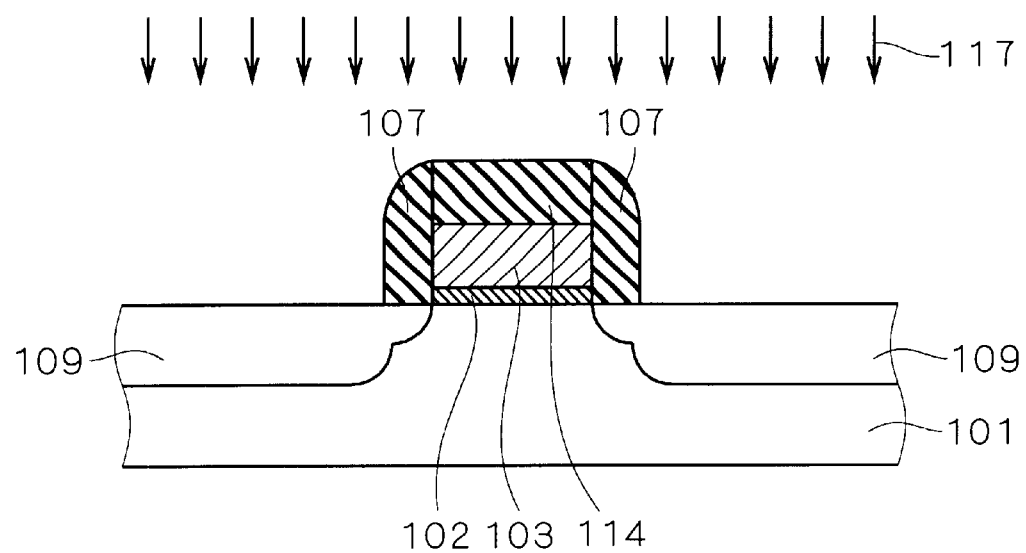
Figure 39:
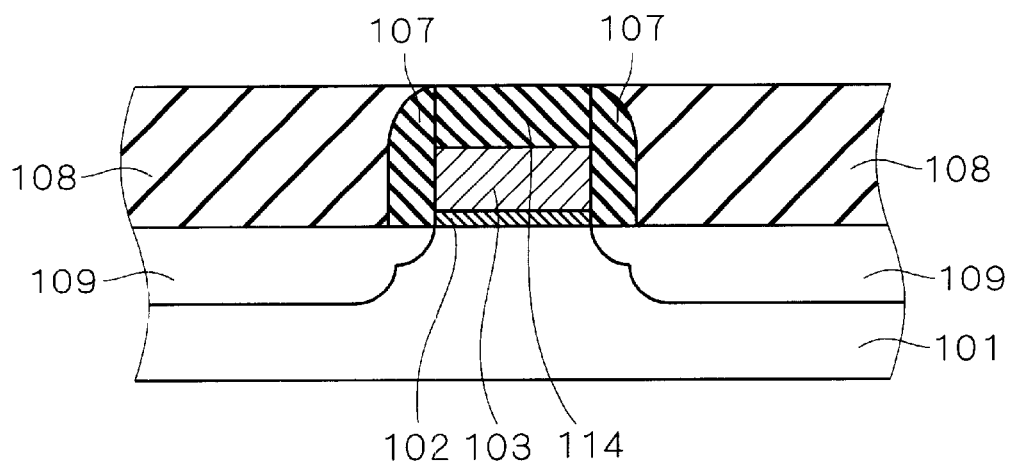
Figure 40:
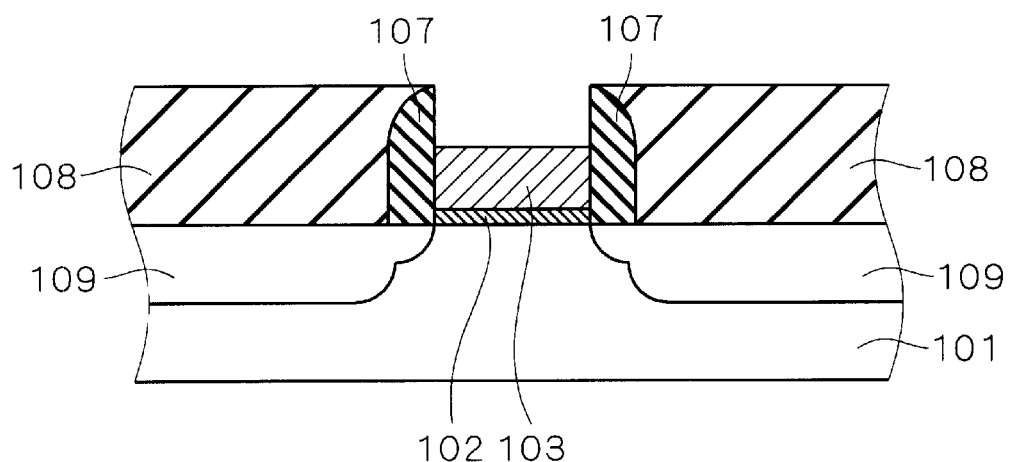
Figure 41:
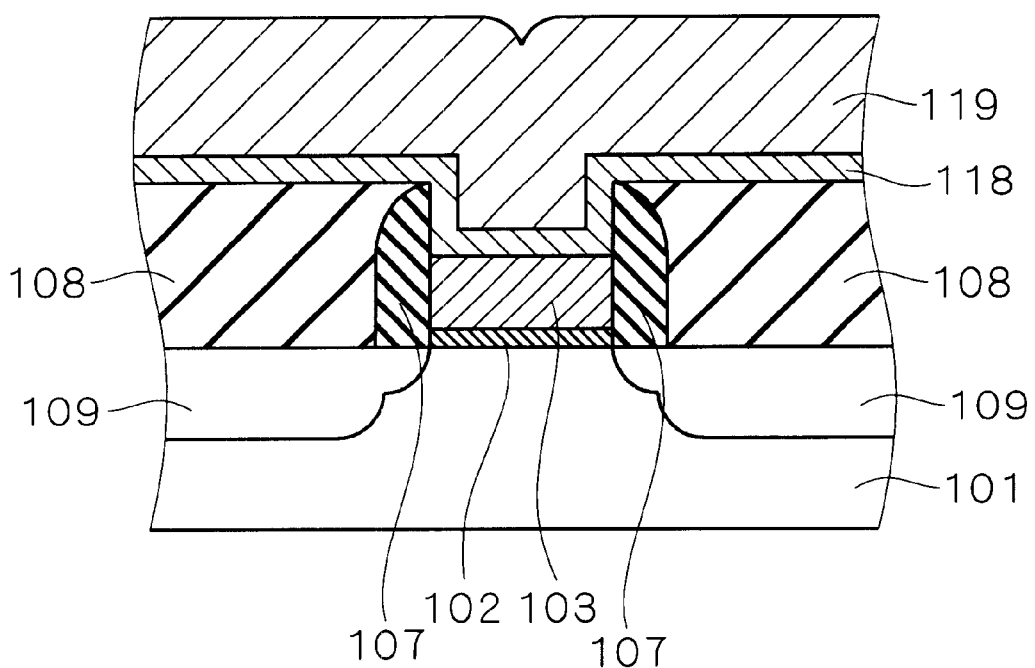

Then, a metal film 66 is deposited on the entire surface of the resultant structure so as to fill the recess 62, and is polished by a CMP process until the upper surface of the silicon oxide films 4 is exposed. This provides a gate structure 67 including the gate oxide film 5, the silicon oxide films 61 and the metal film 66 (FIG. 33). After the steps of forming an interlayer insulation film and forming an interconnect line and the like, the device is completed.

In the method of manufacturing the semiconductor device according to the fifth preferred embodiment, the doped regions such as the channel region 2 and the pocket regions 65 are formed in the silicon substrate 1 after the source/drain regions 3 are formed. Therefore, the impurities in the channel region 2 and the pocket regions 65 are not affected by the heat treatment for the formation of the silicon oxide film 61 and the source/drain regions 3. This avoids excessive thermal diffusion of the channel region 2 and the pocket regions 65, to prevent the channel region 2 from being formed in a deeper position in the silicon substrate 1 and the channel resistance from increasing, providing a high-performance transistor. Additionally, the gate structure 67 is formed in a self-aligned fashion by using the silicon oxide films 4 serving as a mask against ion implantation.

While the invention has been described in detail, the foregoing description is in all aspects illustrative and not restrictive. It is understood that numerous other modifications and variations can be devised without departing from the scope of the invention.

What is claimed is:

1. A method of manufacturing a semiconductor device, comprising the steps of:
   (a) selectively forming a multilayer structure including a gate insulation film and a dummy gate electrode stacked in the order named on an upper surface of a substrate, said dummy gate electrode having an upper part and a lower part;
   (b) forming a first insulation film in a side surface of said lower part, wherein said first insulation film is formed by thermally oxidizing said dummy gate electrode in said step (b);
   (c) forming a pair of source/drain regions in said upper surface of said substrate, with part of said upper surface of said substrate which underlies said gate insulation film lying between said pair of source/drain regions;
   (d) forming a second insulation film on said upper surface of said substrate overlying said pair of source/drain regions, said second insulation film having a thickness greater than the height of said first insulation film from said upper surface of said substrate, said second insulation film being in contact with said dummy gate electrode;
   (e) removing said dummy gate electrode while leaving said first insulation film, said step (e) being performed after said step (d); and
   (f) forming a gate electrode filling a recess defined by said gate insulation film and said first and second insulation films.

2. The method according to claim 1,
   wherein a thermal oxidation reaction proceeds at a lower rate in said upper part than in said lower part in said step (a).

3. The method according to claim 2, further comprising the step of
   (x) introducing an impurity into said upper surface of said substrate by using said dummy gate electrode as a mask to form an extension region, said step (x) being performed between said steps (a) and (b).

4. The method according to claim 2,
   wherein only said upper part is doped with an impurity having an oxidation inhibiting effect in said step (a).

5. The method according to claim 4,
   wherein said impurity is a nitrogen ion.

6. The method according to claim 2,
   wherein only said lower part is doped with an impurity having an oxidation promoting effect in said step (a).

7. The method according to claim 6,
   wherein said impurity is an ion selected from the group consisting of oxygen and argon.

8. The method according to claim 2,
   wherein said dummy gate electrode formed in said step (a) has said lower part made of a first material which is thermally oxidizable, and said upper part made of a second material which is not thermally oxidizable.

9. The method according to claim 8,
   wherein said step (a) comprises the steps of:
   (a-1) forming a polysilicon film of said first material and a silicon oxide film of said second material in stacked relation in the order named on the entire upper surface of said substrate;
   (a-2) etching away said silicon oxide film except where said dummy gate electrode is to be formed; and
   (a-3) etching away said polysilicon film by using said silicon oxide film as a mask, said step (a-3) being performed after said step (a-2).

10. The method according to claim 8,
    wherein said step (a) comprises the steps of:
    (a-1) forming a third material serving as a material of said gate insulation film, said first material and said second material in stacked relation in the order named on the entire upper surface of said substrate;
    (a-2) forming a photoresist on an upper surface of said second material in a region wherein said dummy gate electrode is to be formed; and
    (a-3) continuously etching said second material and said first material in the order named by using said photoresist as a mask.

11. The method according to claim 1,
    wherein said gate electrode formed in said step (f) includes a metal film with a barrier metal serving as an underlying layer.

12. The method according to claim 1,
    wherein said dummy gate electrode includes a polysilicon film;
    wherein only part of said dummy gate electrode which lies above an upper end of said first insulation film is removed in said step (e); and
    wherein said step (f) comprises the step of forming a conductive film filling a recess surrounded by a side surface of said second insulation film exposed in said step (e) and an upper surface of said dummy gate electrode left after said step (e).

13. The method of claim 1, further comprising:
    after step (e), introducing an impurity into said substrate through a recess defined by said gate insulation film and said first and second insulation films.

14. The method of claim 13, wherein said introducing is ion implantation angled with respect to the normal to said upper surface of said substrate.

* * * * *